(12) United States Patent
Eckinger et al.

(10) Patent No.: US 10,996,125 B2
(45) Date of Patent: May 4, 2021

(54) PRESSURE SENSORS AND METHOD FOR FORMING A MEMS PRESSURE SENSOR

(71) Applicant: Infineon Technologies AG, Neubiberg (DE)

(72) Inventors: Markus Eckinger, Regenstauf (DE); Dirk Hammerschmidt, Finkenstein (AT); Florian Brandl, Wolnzach (DE); Bernhard Winkler, Regensburg (DE)

(73) Assignee: Infineon Technologies AG

( * ) Notice: Subject to any disclaimer, the term of this patent is extended or adjusted under 35 U.S.C. 154(b) by 232 days.

(21) Appl. No.: 15/976,111

(22) Filed: May 10, 2018

(65) Prior Publication Data
US 2018/0335359 A1 Nov. 22, 2018

(30) Foreign Application Priority Data

May 17, 2017 (DE) .................... 10 2017 110 663.4
Oct. 9, 2017 (DE) .................... 10 2017 123 431.4

(51) Int. Cl.
*G01L 9/00* (2006.01)
*B81B 3/00* (2006.01)
*B81C 3/00* (2006.01)

(52) U.S. Cl.
CPC .......... *G01L 9/0072* (2013.01); *B81B 3/0021* (2013.01); *B81C 3/001* (2013.01); *B81B 2201/0264* (2013.01); *B81B 2203/0127* (2013.01); *B81B 2203/04* (2013.01); *B81B 2207/012* (2013.01); *B81C 2203/032* (2013.01)

(58) Field of Classification Search
CPC . B81C 3/001; B81C 2203/032; B81B 3/0021; B81B 2201/0264; B81B 2207/012; B81B 2203/04; B81B 2203/0127; G01L 9/0072; G01L 9/0073; G01L 27/002; G01L 19/144; G01L 19/147; G01L 1/04; G01L 1/142; G01L 1/148; G01L 25/00; G01L 9/0005; G01L 9/0044; G01L 9/0047; G01L 9/0048; G01L 9/005; G01L 9/0052
See application file for complete search history.

(56) References Cited

U.S. PATENT DOCUMENTS

| | | | |
|---|---|---|---|
| 8,334,159 B1* | 12/2012 | Fu ......................... | G01L 9/0073 438/53 |
| 2003/0119221 A1* | 6/2003 | Cunningham ......... | H01H 61/04 438/52 |
| 2015/0090043 A1* | 4/2015 | Ruhl ..................... | G01L 9/0048 73/777 |
| 2015/0090052 A1* | 4/2015 | Dawson ................ | G01L 9/0073 73/862.626 |
| 2015/0160089 A1* | 6/2015 | Dawson ................. | H01L 41/08 73/1.59 |
| 2017/0122825 A1* | 5/2017 | Naumann ............. | G01L 9/0072 |
| 2017/0362083 A1* | 12/2017 | Yee ....................... | B81C 99/008 |

* cited by examiner

*Primary Examiner* — Nimeshkumar D Patel
*Assistant Examiner* — Gedeon M Kidanu
(74) *Attorney, Agent, or Firm* — Design IP

(57) ABSTRACT

A pressure sensor is provided. The pressure sensor includes at least two electrodes and an integrated circuit configured to sense a capacitance between the at least two electrodes. Further, the pressure sensor includes a Microelectromechanical System (MEMS) structure including a conductive or dielectric membrane configured to move, depending on the pressure, relative to the at least two electrodes.

33 Claims, 12 Drawing Sheets

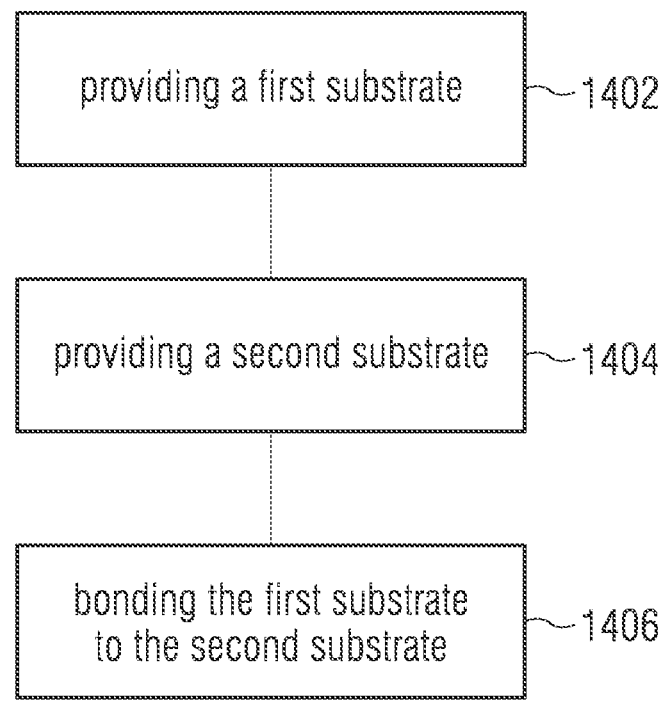

PRESSURE SENSORS AND METHOD FOR FORMING A MEMS PRESSURE SENSOR

FIELD

This disclosure relates generally to pressure sensing, and more particularly, to pressure sensors and a method for forming a Microelectromechanical System (MEMS) Microelectromechanical pressure sensor.

BACKGROUND

Conventional surface micro machined pressure sensor cells include a membrane that is made of polysilicon and forms one electrode of a capacitor. The other electrode is implanted in the silicon bulk. Under pressure the membrane deflects and increases the capacitance of the structure. The cells are usually connected to form capacitor arrays in order to increase the measurable change of the capacitance to a level which is electronically measurable with sufficient signal to noise ratio.

Alternatives are bulk micro machined pressure sensors that use the silicon bulk as membrane that deflects under pressure. Those structures are usually packaged between glass wafers or other silicon wafers which form the pressure port and in case of an absolute pressure sensor an evacuated cavity on the other side. The large majority of those bulk micro machined pressure sensors use piezo resistors to convert the pressure induced stress into a measurable electrical property. Also capacitive conversion using floating counter electrodes on a glass structure that is bonded on the top surface of the Integrated Circuit (IC) may be used. The disadvantage of such a solution is the need of a huge area on the front side of the IC for the anodic bonding between silicon and glass.

The manufacturing of the above sensor structures may be costly. Moreover, conventional pressure sensors based on the piezoelectric effect may suffer several drawbacks. For example, piezoelectric sensor concepts may be hard to integrate and sensitive to stress. Hence, there may be a demand for pressure sensors enabling reduced manufacturing costs and avoiding these drawbacks.

SUMMARY

One or more embodiments relate to a pressure sensor. The pressure sensor includes at least two electrodes and an integrated circuit configured to sense a capacitance between the at least two electrodes. Further, the pressure sensor includes a Microelectromechanical System (MEMS) structure including a conductive or dielectric membrane configured to move, depending on the pressure, relative to the at least two electrodes.

One or more embodiments relate to a further pressure sensor. The pressure sensor includes a magnetic sensor element configured to generate a signal based on a magnetic field sensed by the magnetic sensor element. Further, the pressure sensor includes a MEMS structure including a membrane configured to move, depending on the pressure, relative to the magnetic sensor element. The pressure sensor additionally includes a field influencing element configured to modify the magnetic field based on a movement of the membrane, wherein the field influencing element is arranged on the membrane.

One or more embodiments relate to a sensor device including an array of one of the above pressure sensors.

One or more embodiments relate to a method for forming a MEMS pressure sensor. The method includes providing a first substrate including in a recessed portion a recess and a membrane shaped by the recess. The membrane includes at least one field influencing element. Further, the method includes providing a second substrate including a read-out element and a read-out circuit coupled to the read-out element. The method additionally includes bonding the first substrate to the second substrate such that the recess is hermetically sealed, thereby forming a sealed cavity.

BRIEF DESCRIPTION OF THE DRAWINGS

Some examples of apparatuses and/or methods will be described in the following by way of example only, and with reference to the accompanying figures, in which

FIG. 14 illustrates a flowchart of an example of a method for forming a MEMS pressure sensor according to one or more embodiments.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
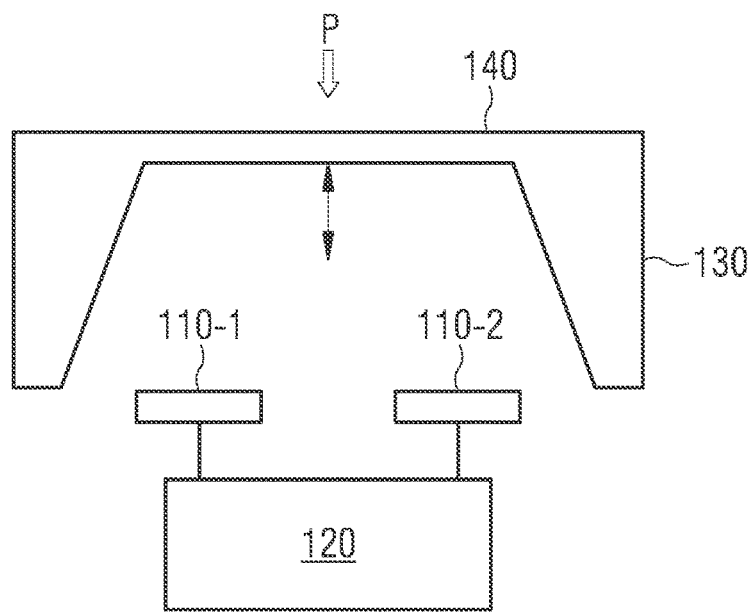
FIG. 1 illustrates an example of a pressure sensor according to one or more embodiments.

FIG. 1 illustrates a pressure sensor 100. The pressure sensor 100 comprises at least two electrodes 110-1, 110-2 and an integrated circuit 120 configured to sense a capacitance between the at least two electrodes 110-1, 110-2. Further, the pressure sensor 100 comprises a Microelectromechanical System (MEMS) structure 130 comprising a conductive or dielectric membrane 140 configured to move, depending on the pressure P, relative to the at least two electrodes 110-1, 110-2.

The pressure sensor 100 may be manufactured more cost-effective than conventional pressure sensors since the membrane 140 is not used as electrode—the at least two electrodes 110-1, 110-2 used for measuring the pressure are separate from the MEMS structure 130. For example, the at least two electrodes 110-1, 110-2 may be arranged on a rigid region of the pressure sensor 100. The conductive or dielectric membrane 140 is merely used to influence the capacitance between the at least two electrodes 110-1, 110-2, without being directly sensed by or connected to the integrated circuit. Accordingly, the MEMS structure 130 and the semiconductor die of the MEMS structure may be free from electronic components (e.g. electrodes, electrical wires, transistors) and may be manufactured in a pure MEMS process. Further, the MEMS structure 130 may have no electrical connection to the integrated circuit 120. Since the conductive or dielectric membrane 140 moves relative to the at least two electrodes 110-1, 110-2 depending on the pressure P, the capacitance between the at least two electrodes 110-1, 110-2 varies depending on the pressure P, i.e. the position of the membrane 140.

The at least two electrodes 110-1, 110-2 may be configured to generate an alternating electric field. Accordingly, the conductive or dielectric membrane 140 may couple with the alternating electric field and, hence, influence the capacitance between the at least two electrodes 110-1, 110-2, which is sensed by the integrated circuit 120 (e.g. by sensing a current or voltage variation).

The at least two electrodes 110-1, 110-2 may, in some examples, be separated from the membrane by a cavity. The cavity may be an evacuated cavity, such that an absolute value of the pressure P may be measured.

The pressure sensor 100 may comprise an integrated circuit die (not illustrated) which comprises the integrated circuit 120. The integrated circuit 120 is configured to calculate the pressure P based on the capacitance between the at least two electrodes 110-1, 110-2.

In some examples, the integrated circuit die and the MEMS structure 130 are attached to opposite sides of a carrier substrate (not illustrated), such that the evacuated cavity is formed between the membrane 140 and the carrier substrate. The carrier substrate is made of a material that ensures hermetic sealing with the MEMS structure 130 at the contact surfaces. The carrier substrate may, e.g., be an intermediate wafer made of silicon, ceramic or glass.

A metal layer may be formed on the membrane 140 and/or a contact surface of the MEMS structure 130 for contacting the carrier substrate in order to improve the conductivity of the membrane 140 and/or to support the bonding of the MEMS structure 130 to the carrier substrate.

The at least two electrodes 110-1, 110-2 may be arranged on the same surface side of the carrier substrate. For example, the at least two electrodes 110-1, 110-2 may be arranged on the same surface side of the carrier substrate as the integrated circuit die. Alternatively, the at least two electrodes 110-1, 110-2 and the integrated circuit die may be arranged on opposite surface side of the carrier substrate. That is, the at least two electrodes 110-1, 110-2 may be arranged in the cavity between the membrane 140 and the carrier substrate.

If the at least two electrodes 110-1, 110-2 and the integrated circuit die are arranged on opposite surface sides of the carrier substrate, the integrated circuit 120 may, e.g., be coupled to the at least two electrodes 110-1, 110-2 by vias penetrating the carrier substrate.

In some examples, the carrier substrate is made of dielectric material (e.g. silicon or ceramic) and the at least two electrodes 110-1, 110-2 are arranged within the integrated circuit die. Further, the at least two electrodes 110-1, 110-2 are arranged between semiconductor layers of the integrated circuit 120 and the MEMS structure 130. For example, the at least two electrodes 110-1, 110-2 maybe arranged on top of a metallization layer of the integrated circuit 120. This may allow to use any kind of technology for manufacturing the integrated circuit 120, since the at least two electrodes 110-1, 110-2 are arranged on top of the semiconductor layers of the integrated circuit 120. Due to the carrier substrate out of dielectric material, a sufficient coupling of the membrane 130 to the alternating field of the at least two electrodes 110-1, 110-2 is ensured. To further support this coupling, the integrated circuit die may be glued to the carrier substrate using a dielectric glue.

As an alternative, the MEMS structure 130 and the integrated circuit die may be directly attached to each other, i.e. without a carrier substrate in between. For example, the MEMS structure 130 may be attached to a surface of the integrated circuit die such that a cavity (e.g. an evacuated cavity or a hermetically sealed cavity) is formed between the membrane 130 and the integrated circuit die.

Similarly, a metal layer may be formed on the membrane 130 and/or a contact surface of the MEMS structure 140 for contacting the integrated circuit die in order to improve the conductivity of the membrane 140 and/or to support the bonding of the MEMS structure 130 to the integrated circuit die.

The metal layer formed on the contact surface of the MEMS structure may, in some examples, serve as one of the at least two electrodes 110-1, 110-2. Alternatively, the at least two electrodes 110-1, 110-2 may be different from the metal layer.

In the pressure sensor 100, a vertical distances between the membrane 130 and the at least two electrodes 110-1, 110-2 may be smaller than a distance between the at least two electrodes 110-1, 110-2 so that the electrical field between the membrane 130 and the at least two electrodes 110-1, 110-2 is stronger than an electrical stray field between the at least two electrodes 110-1, 110-2 themselves.

In some examples, the integrated circuit and the MEMS structure 130 are arranged on opposite sides of a semiconductor substrate of the integrated circuit die. That is, the MEMS structure 130 may be arranged on a backside of the integrated circuit die. Since the MEMS structure 130 is bonded to the back of the integrated circuit die, chip area may be saved compared to solutions in which the MEMS structure 130 is arranged on the front side of the integrated circuit die, i.e. in which the MEMS structure 130 is arranged on top of the integrated circuit.

Also the integrated circuit 120 and the at least two electrodes 110-1, 110-2 may be arranged on opposite sides of the semiconductor substrate of the integrated circuit die. The integrated circuit 120 may then be coupled to the at least two electrodes 110-1, 110-2 by, e.g., vias penetrating the semiconductor substrate.

As indicated above, the MEMS structure 130 may also be arranged on top of the integrated circuit 120, i.e. the integrated circuit 120 may be arranged between the MEMS structure 130 and the semiconductor substrate of the integrated circuit die. If the MEMS structure 130 is arranged on top of the integrated circuit 120, the integrated circuit die may comprise a passivation layer which is arranged between the integrated circuit 120 and the MEMS structure 130. The at least two electrodes 110-1, 110-2 may be formed on the passivation layer.

In the following, some exemplary implementations of the above general concept will be described in connection with FIGS. 2a to 9.

Figure 2A:
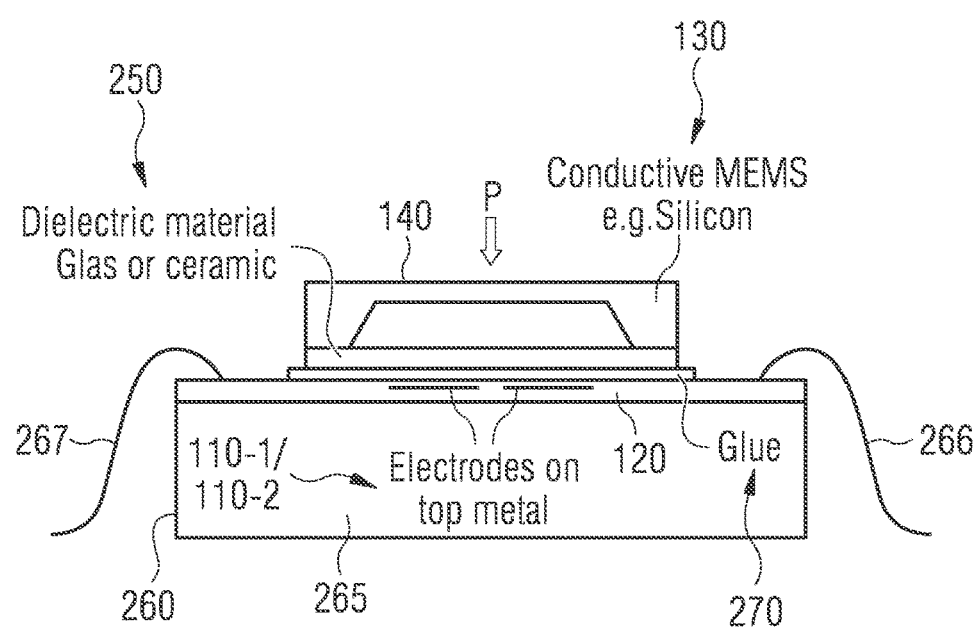
FIGS. 2a-2h illustrate a pressure sensor according to one or more embodiments.

FIG. 2a illustrates a pressure sensor 200. The pressure sensor 200 comprises a MEMS structure 130 comprising a conductive or dielectric membrane 140. The MEMS structure 130 is attached (e.g. bonded) to a first surface of a dielectric bottom plate 250 (e.g. made of glass or ceramic) which serves as carrier substrate. The MEMS structure 130 may consist of nothing else but structured silicon and includes membrane 140, i.e. the MEMS structure 130 may be free from electronic components. The MEMS structure 140 encapsulates a vacuum with the dielectric bottom plate 250. Further, the membrane 140 is exposed to a pressure P.

An integrated circuit die 260 is glued to an opposite second surface of the dielectric bottom plate 250 by means of a dielectric glue 270 in order to achieve stress decoupling between the MEMS structure 130 and the integrated circuit die 260. The integrated circuit die 260 comprises an integrated circuit 120, which is arranged on top of a semiconductor substrate 265 of integrated circuit die 260. The integrated circuit 120 is contacted from the outside by bond wires 266 and 267.

Two electrodes 110-1, 110-2 are arranged on the top metal layer of the integrated circuit 120. That is, the two electrodes 110-1, 110-2 are arranged within the integrated circuit die 260 and are arranged between semiconductor layers of the integrated circuit 120 and the MEMS structure 130. The two electrodes 110-1, 110-2 generate an alternating electric field.

The membrane 140 moves relative to the two electrodes 110-1, 110-2 depending on the pressure P. Since the conductive membrane 140 couples with the alternating electric field, the capacitance between two electrodes 110-1, 110-2 depends on the movement of the membrane 140 and, hence, on the pressure P. That is, the two electrodes 110-1, 110-2 allow to read-out the membrane deflection due to the pressure P. The capacitance between the two electrodes 110-1, 110-2 is sensed by the integrated circuit 120 (e.g. by sensing a current or voltage variation), which calculates the pressure P from the sensed capacitance. That is, the integrated circuit 120 may allow to determine the pressure P without being electrically (galvanically) coupled to the MEMS structure 130 (i.e. the MEMS structure 130 may be galvanically/electrically isolated from the integrated circuit 120).

The structure of the pressure device 200 allows to glue a MEMS structure 130 on a chip/die of any integrated circuit technology. Furthermore, no bonds to the MEMS structure 130 are required since the read-out is done via the electric field from the side of the integrated circuit 120. Accordingly, the pressure sensor 200 may be manufactured in a cost-effective manner since the MEMS structure 130 may be manufactured in a pure MEMS process, and may be easily glued to the dielectric bottom plate 250. Likewise, the integrated circuit die 260 may manufactured in any integrated circuit technology without any modifications, and simply glued to the dielectric bottom plate 250.

Figure 2B:
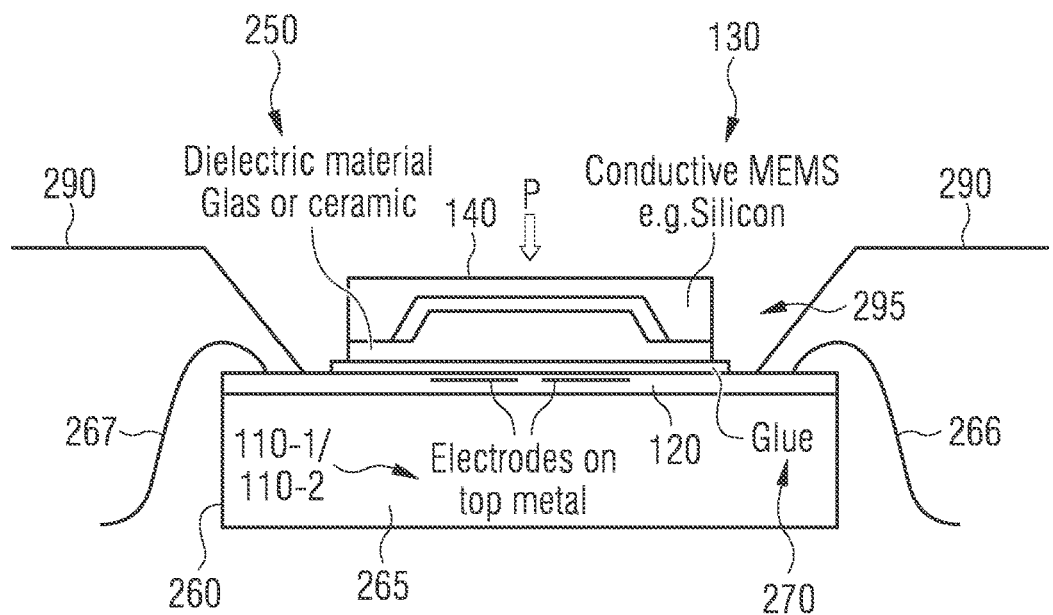

As illustrated in FIG. 2b, a layer thickness of the dielectric bottom plate 250, i.e. the carrier substrate may vary. In other words, the dielectric bottom plate 250 may be structured. For example, the layer thickness of the dielectric bottom plate 250 may be increased in a region of the dielectric bottom plate 250 between the MEMS structure 130 and at least one of the two electrodes 110-1, 110-2. In other words, the layer thickness of a first region of the dielectric bottom plate 250 facing at least one of the two electrodes 110-1, 110-2 may be greater than the layer thickness of a second region of the dielectric bottom plate 250 not facing the two electrodes 110-1, 110-2. This may allow improved coupling of the membrane 140 to the alternating electric field. In FIG. 2b, the thickness of the dielectric bottom plate 250 of pressure sensor 200' is equally increased in a region of the dielectric bottom plate 250 between the MEMS structure 130 and both electrodes 110-1, 110-2. However, it is to be noted that also other structures providing an increased thickness in a region of the dielectric bottom plate 250 between the MEMS structure 130 and at least one of the two electrodes 110-1, 110-2 may be used.

Optionally, a metal layer may be provided on the first region of the dielectric bottom plate 250. This may allow further improved coupling of the membrane 140 to the alternating electric field.

Further illustrated in FIG. 2b is a package 290 made of mold material. The package 290 at least partly encapsulates the integrated circuit die 260 as well as the bond wires 266 and 267. Further, the package 290 provides a mold opening 295 to let the pressure P reach the membrane 140. The package 290 may, e.g., be manufactured by Film Assisted Molding (FAM). The package 290 may enable protection of the bond wires 266 and 267 without contacting the MEMS structure 130. Hence, a direct transfer of stress from the package 290 to the MEMS structure 130 may be avoided.

Figure 2C:
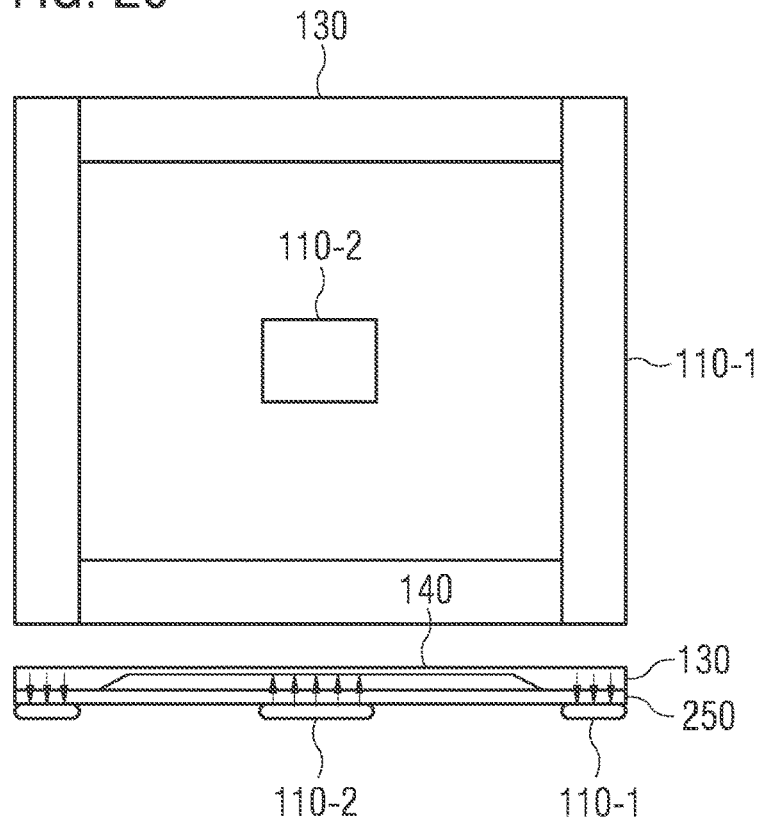

FIG. 2c further illustrates an alternative arrangement of the at least two electrodes 110-1, 110-2. FIG. 2c omits some features/components of the pressure sensors illustrated in FIGS. 2a, 2b in order to highlight the arrangement of the electrodes 110-1, 110-2 relative to the MEMS structure 130. Compared to FIGS. 2a and 2b, the electrodes 110-1, 110-2 are spaced further apart from each other, so that the electrical field between each of the electrodes 110-1, 110-2 and the membrane 140 is stronger than the electrical stray field between the electrodes 110-1, 110-2. As illustrated in FIG. 2c, vertical distances (distance in a direction orthogonal to the main surface of the dies) between the membrane 140 and the two electrodes 110-1, 110-2 may be smaller than a distance between the at least two electrodes 110-1, 110-2. In other words, the distance between the electrodes 110-1, 110-2 may be larger than the vertical distance between membrane 140 and the electrode surface. With this geometry, the capacitance over the airgap is dominant compared to the rest of the coupling capacitance through the dielectric bottom plate 250 (e.g. glass) and the direct stray capacitance between the electrodes 110-1, 110-2.

Figure 2D:
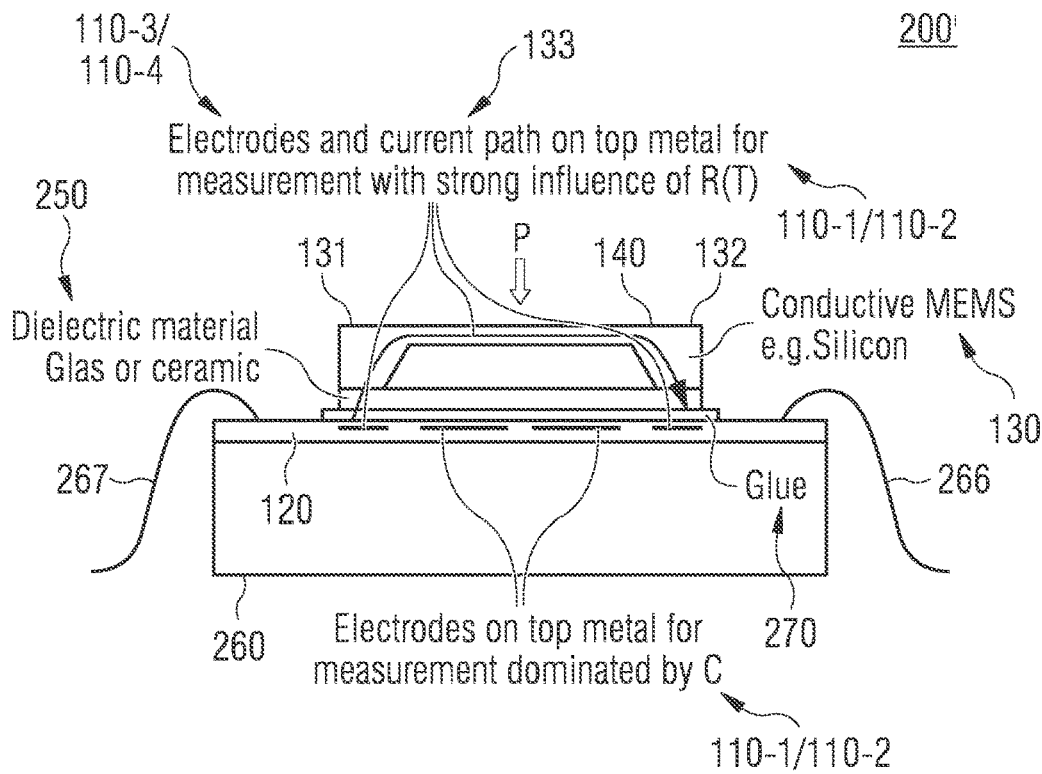

In FIG. 2d, a further enhanced pressure sensor 200' is illustrated. Pressure sensor 200' is identical to pressure sensor 200 described above, except that pressure sensor 200' comprises additional electrodes 110-3 and 110-4.

The additional electrodes 110-3 and 110-4 are arranged below rim portions 131, 132 of the MEMS structure 130 which carry the membrane 140. The alternating electric field generated by the additional electrodes 110-3, 110-4 causes a current path 133 through the MEMS structure 130. Since the additional electrodes 110-3 and 110-4 are arranged below rim portions 131, 132 of the MEMS structure 130, the capacitance between the electrodes is not influenced by the movement of the membrane, i.e. the pressure P. By measuring the pressure independent capacitance between the additional electrodes 110-3 and 110-4, the temperature of the MEMS structure 130 may be determined since the resistance R of the MEMS structure 130 depends on its temperature T. This may allow to determine the temperature of the MEMS structure 130, which itself is free from electronic components and is not electrically (galvanically) coupled to the integrated circuit 120. Furthermore, influences on the capacitance between the electrodes 110-1 and 110-2 due to aging effects of the dielectric glue 270 (e.g. the glue 270 may undergo aging dependent thickness variations) may be determined.

As further illustrated in FIGS. 2e to 2h, different set-ups of multiplexed electrodes may be used to extract multiple measurements that include more or less pressure and temperature dependent measurements. By using linearly independent measurements, the influence of temperature and also aging dependent effects of the glue (e.g. thickness variations) may be cancelled out and the precision of the pressure measurement may, hence, be increased. The technique described in connection with FIGS. 2e to 2h may allow to determine the pressure using pressure sensors with a very simple structure (integrated circuit, electrodes and a pure MEMS structure that is free from any electronic components) and simple bonding of the sensor components (no electrical contacting of MEMS structure required).

Figure 2E:
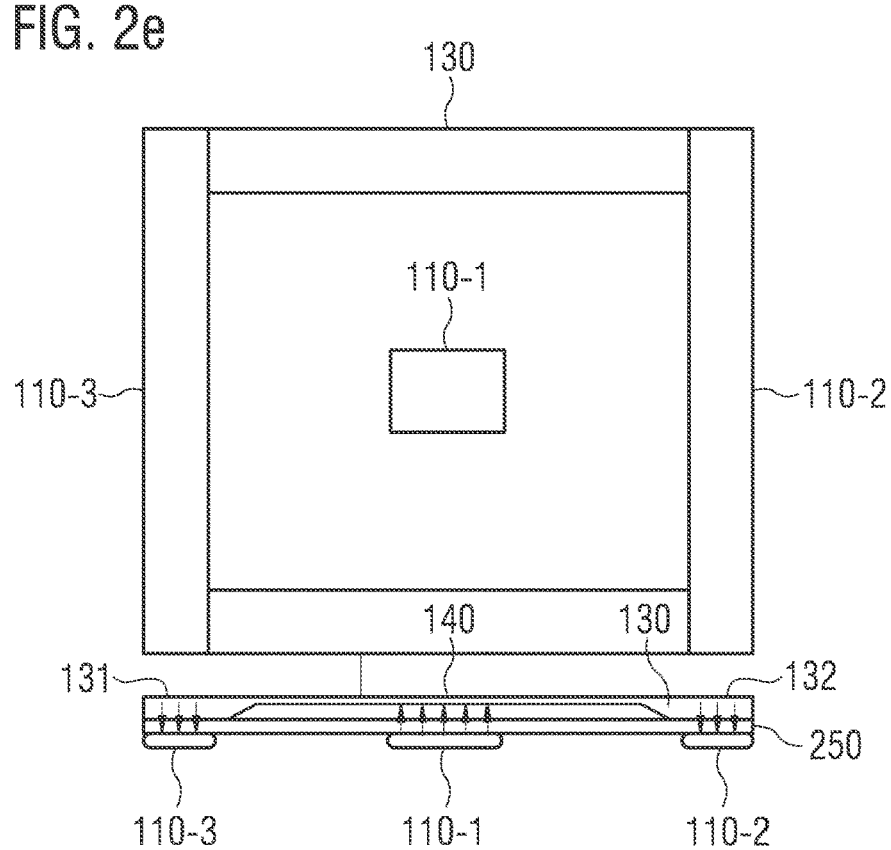

FIG. 2e illustrates a first measurement set-up. FIG. 2e omits some features/components of the pressure sensors illustrated in FIG. 2d in order to highlight the arrangement of the electrodes relative to the MEMS structure. In the upper part of FIG. 2e, a plan view is given, whereas in the lower part of FIG. 2e, a side view is given.

First to third electrodes 110-1, 110-2 and 110-3 generate the alternating electric field in the example of FIG. 2e. A first electrode 110-1 is arranged below a center of the membrane 140. A second electrode 110-2 and a third electrode 110-3 are arranged on opposite sides of the first electrode 110-1 and are respectively arranged below rim portions 131, 132 of the MEMS structure 130 carrying the membrane 140. In other words, this set-up uses electrodes below the rim of the MEMS die (e.g. made of silicon) and an electrode in the middle. The second and third electrodes 110-2 and 110-3 may also be understood as two parts of a single electrode. The gap between the middle first electrode 110-1 and the membrane 140 is changed by the deflection of the membrane 140 and induces pressure sensitivity.

The integrated circuit (not illustrated) measures the capacitance between the first and the second electrode 110-1, 110-3 as well as the capacitance between the first and the third electrode 110-1, 100-3. Accordingly, the measured capacitances are pressure sensitive. That is, the integrated circuit may determine the pressure without being electrically (galvanically) coupled to the MEMS structure 130.

Figure 2F:
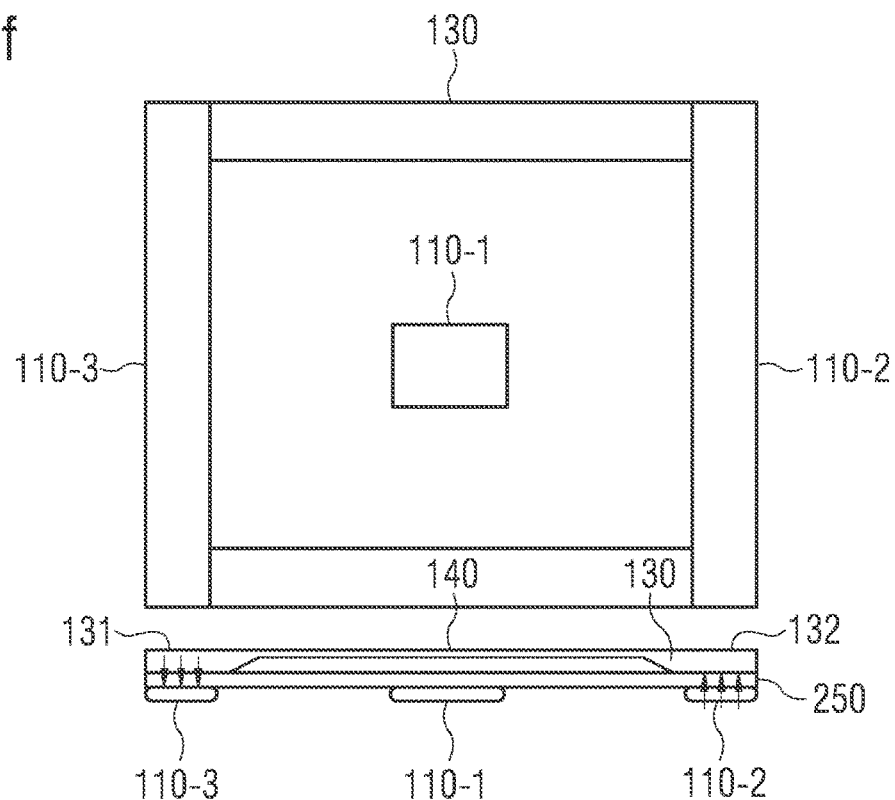

A second measurement set-up is illustrated in FIG. 2f. In this measurement set-up, only the second and the third electrode 110-2, 110-3 placed below the rim portions 131, 132 of the MEMS structure 130 generate the alternating electric field. The first electrode 110-1 is not used. Accordingly, a current path along the whole MEMS structure 130 is formed. That is, in this measurement set-up the connectivity of the MEMS die is used. In the example of FIG. 2f, the influence of the deflecting membrane is completely eliminated from the coupling path since the conductivity is dominated by the massive bulk material of the side walls (rim portions) of the MEMS structure 130.

The integrated circuit (not illustrated) measures the capacitance between the second and the third electrode 110-2, 110-3. The measurement may deliver two different measurement effects depending on the frequency. At low frequencies, the measurement substantially depends on the capacitance contributions of the carrier substrate 250 (e.g. a bonded glass wafer) and the glue (not illustrated). This may be used to cancel out variations of the pressure sensitive measurement (illustrated in FIG. 2e) which may be caused by lifetime variations of the glue. At higher frequencies (depends on the RC time constant of the measurement capacitive coupling path and the resistance of the MEMS structure 130 from one to the other side), the temperature dependence of the MEMS conductivity will introduce a phase shift between an alternating voltage signal applied between the second and third electrodes 110-2, 110-3 and the resulting current flow (or vice versa). By providing the MEMS structure 130 with a suitable resistance (e.g. by doping silicon material with a suitable dopant concentration), the phase shift may be used as temperature measurement.

That is, the integrated circuit (not illustrated) may calculate the pressure with increased precision based on (a combination of) a first capacitance between the second electrode 110-2 and the third electrode 110-3, a second capacitance between the first electrode 110-1 and the second electrode 110-2, and a third capacitance between the first electrode 110-1 and the third electrode 110-3.

Alternatively, a measurement with reduced pressure sensitivity may be realized by using one or more reference electrodes located in membrane regions which are deflected less than the center region, since they are closer to the rim. This is illustrated by means of FIGS. 2g and 2h.

Figure 2G:
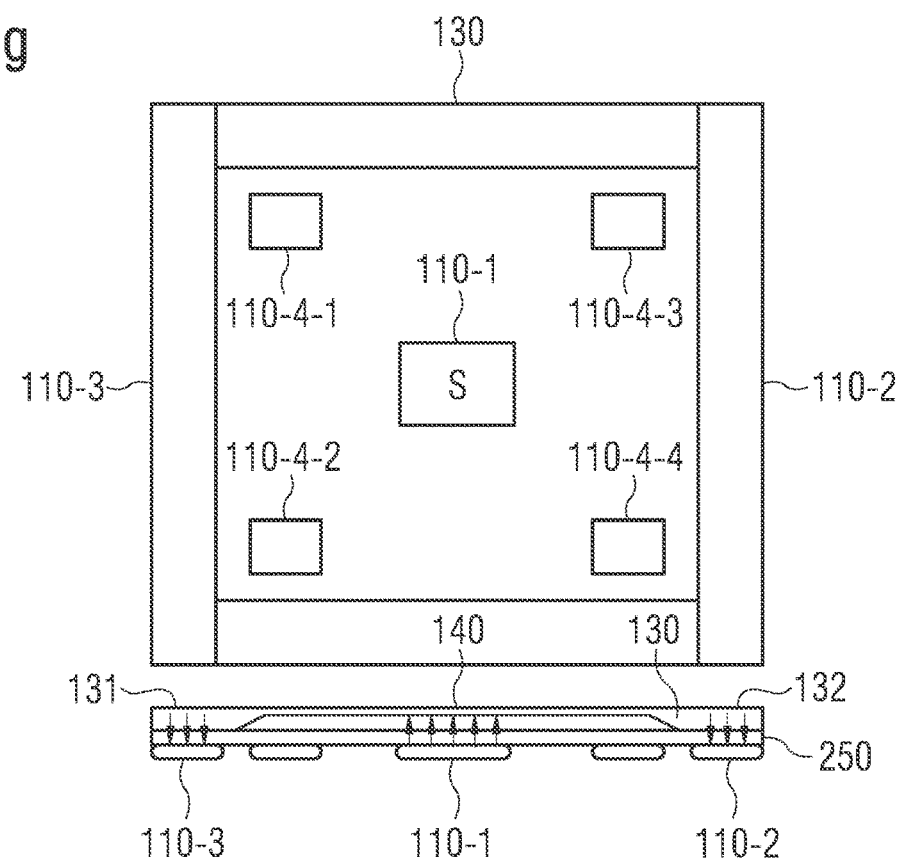

Compared to FIGS. 2e and 2f, the pressure sensor illustrated in FIG. 2g comprises additional fourth electrodes. In the example of FIG. 2g, four fourth electrodes 110-4-1, 110-4-2, 110-4-3 and 110-4-4 are illustrated. However, it is to that any other number of fourth electrodes may be used. For example, one circumferential fourth electrode may be used.

Figure 4:
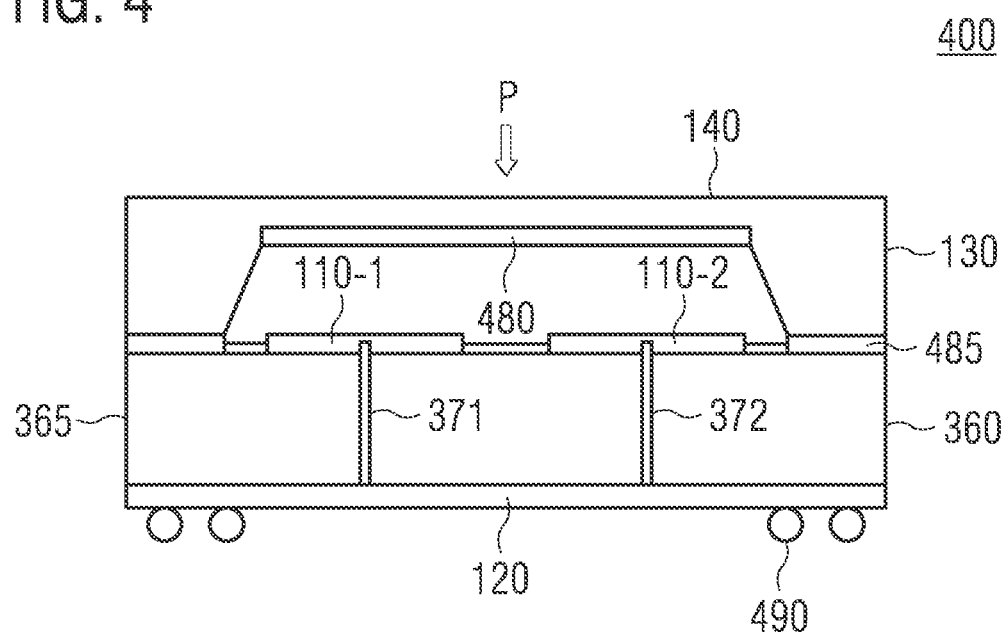
FIG. 4 illustrates a pressure sensor according to one or more embodiments.

The at least one fourth electrode is arranged between the first electrode 110-1 and one of the second and the third electrode 110-2, 110-3, respectively. Minimum distances of the at least one fourth electrode to the second and/or the third electrodes 110-2, 110-3 are smaller than a minimum distance of the at least one fourth electrode to the first electrode 110-1. As illustrated in FIG. 4, the minimum distance of the fourth electrodes 110-4-1, 110-4-2 to the third electrode 110-3 as well as the minimum distance of the fourth electrodes 110-4-3 and 110-4-4 to the second electrode 110-2 is smaller than their minimum distances to the first electrode 110-1.

However, in the highly pressure sensitive set-up of FIG. 2g, the first to third electrodes 110-1, 110-2 and 110-3 generate the alternating electric field. The four fourth electrodes 110-4-1, 110-4-2, 110-4-3 and 110-4-4 are not used. Accordingly, the integrated circuit (not illustrated) measures the capacitance between the first and the second electrode 110-1, 110-3 as well as the capacitance between the first and the third electrode 110-1, 100-3. That is, the measured capacitances are again highly pressure sensitive.

Figure 2H:
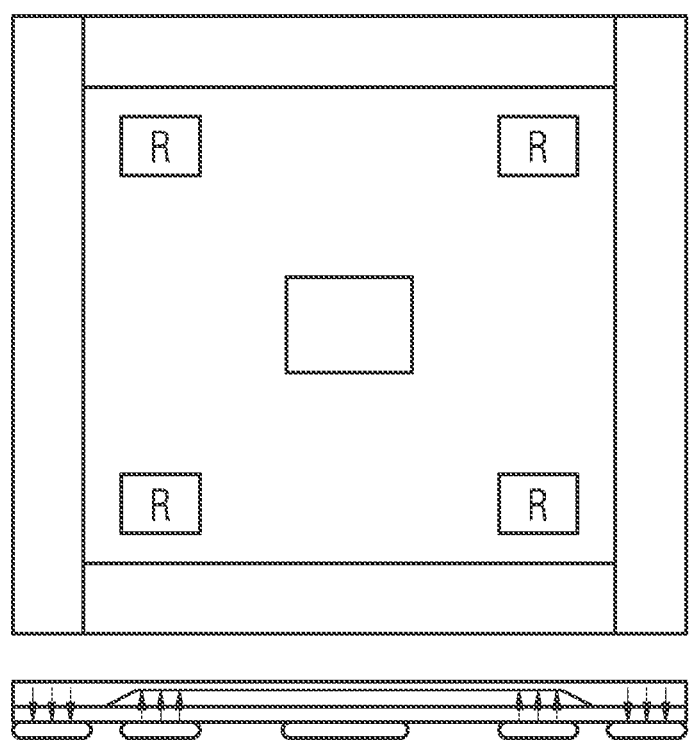

FIG. 2h illustrates another negligibly pressure sensitive measurement set-up. In this set-up, the second electrode 110-2, the third electrode 110-3 and the four fourth electrodes 110-4-1, 110-4-2, 110-4-3 and 110-4-4 generate the alternating electric field. The first electrode 110-1 is not used. Again, the second and third electrodes 110-2 and 110-3 may also be understood as two parts of a single electrode.

Accordingly, the integrated circuit (not illustrated) measures the respective capacitances between the third electrode 110-3 and the fourth electrodes 110-4-1 and 110-4-2 as well as the respective capacitances between the second electrode 110-2 and the fourth electrodes 110-4-3 and 110-4-4.

However, the measurements described in connection with FIGS. 2g and 2h both include a temperature dependence and different pressure dependencies. Using a combination of both measurements (e.g. a polynomial with two variables) may allow to generate a pressure compensated signal for temperature measurement and subsequently a temperature compensated signal for pressure measurement.

That is, the integrated circuit may calculate the pressure with increased precision based on (a combination of) the first capacitance between the second electrode 110-2 and the third electrode 110-3, the second capacitance between the first electrode 110-1 and the second electrode 110-2, the capacitances between the third electrode 110-3 and the fourth electrodes 110-4-1 and 110-4-2 as well as the capacitances between the second electrode 110-2 and the fourth electrodes 110-4-3 and 110-4-4.

As said above, one fourth electrode may be enough for carrying out the measurements described in connection with FIGS. 2g and 2h. Accordingly, the integrated circuit may measure the respective capacitances between the at least one fourth electrode and one of the second and the third electrode 110-2, 110-3. Further, the integrated circuit calculate the pressure based on (a combination of) the first capacitance between the second electrode 110-2 and the third electrode 110-3, the second capacitance between the first electrode 110-1 and the second electrode 110-2, and the respective fourth capacitances between the at least one fourth electrode and one of the second and the third electrode.

In order to increase the sensitivity of the measurements with respect to the pressure, the summed capacitances between the electrodes used for the pressure sensitive measurements may be chosen smaller than the summed capacitances between the electrodes used for the pressure insensitive measurements. For example, the sum of the respective capacitances between the fourth electrodes 110-4-1, 110-4-2 and the third electrode 1010-3 and the respective capacitances between the fourth electrodes the 110-4-3 and 110-4-4 and the second electrode 110-2 may be at least three, four or five times higher than the sum of the respective capacitances between the first electrode 110-1 and one of the second electrode 110-2 and the third electrode 110-3 when the membrane 140 is in a rest position (i.e. the membrane 140 is not deflected).

The measurements described in connection with FIGS. 2e to 2h may be further combined (i.e. the integrated circuit may base the pressure calculation on the capacitances measured using the various measurement set-ups) in order to generate a temperature compensated pressure signal which may further be insensitive to aging variations of the glue (which may be a dominant aging effect of the pressure sensor).

That is, FIGS. 2e to 2h describe a technique in which electrical fields at a mechanical sensor structure (without any electronic devices and being fabricated in a pure MEMS process) are measured. Multiple measurements with different electrode configurations may be performed in order to separate pressure, temperature and aging effects caused by the glue between the mechanical device and the integrated circuit for readout. The technique described in connection with FIGS. 2e to 2h may allow to determine the pressure using pressure sensors with a very simple structure (integrated circuit, electrodes and a pure MEMS structure that is free from any electronic components) and simple bonding of the sensor components (no electrical contacting of MEMS structure required).

Figure 3:
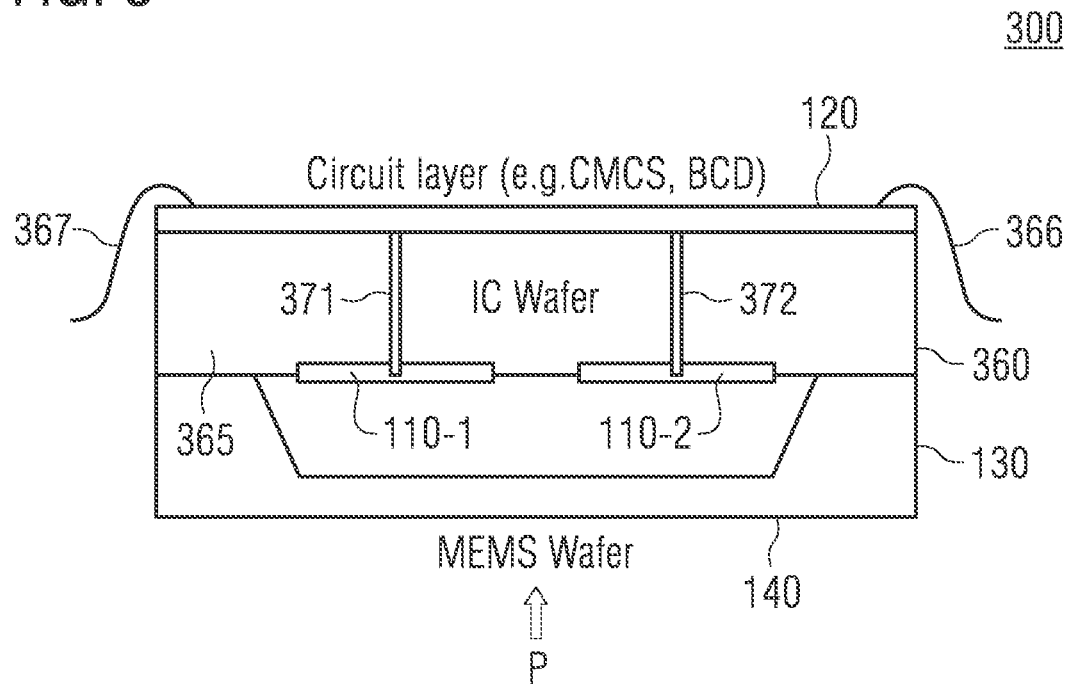
FIG. 3 illustrates a pressure sensor according to one or more embodiments.

Another pressure sensor 300 is illustrated in FIG. 3. The pressure sensor 300 comprises a MEMS structure 130 comprising a conductive or dielectric membrane 140. For example, the MEMS structure 130 may be made from deflectable bulk micro machined wafer without any electronics, i.e. the MEMS structure 130 may use the bulk silicon, metallization and isolation only.

The MEMS structure 130 is attached to a backside surface of integrated circuit die 360 such that a (evacuated) cavity is formed between the membrane 140 and the integrated circuit die 360. Since the MEMS structure 130 is bonded to the backside of the integrated circuit die 360, a waste of chip area may be avoided.

The integrated circuit die 360 comprises an integrated circuit 120 at its front side. Hence, the integrated circuit 120 and the MEMS structure 130 are arranged on opposite sides of a semiconductor substrate 365 of the integrated circuit die 360 with the MEMS structure 130 being on a separate die and attached to the integrated circuit die 360. The integrated circuit 120 is contacted from the outside by bond wires 366 and 367.

Two electrodes 110-1, 110-2 are arranged on the backside surface of the integrated circuit die 360. That is, the integrated circuit 120 and two electrodes 110-1, 110-2 are arranged on opposite sides of the integrated circuit die 360. The integrated circuit 120 is coupled to the two electrodes 110-1, 110-2 by vias 371, 372 penetrating the semiconductor substrate 365 (e.g. through silicon vias).

Again, the membrane 140 moves relative to the two electrodes 110-1, 110-2 depending on the pressure P. The two electrodes 110-1, 110-2 at the backside of the integrated circuit die generate an alternating electric field, which is influenced by the deflectable membrane 140. By measuring the change of the capacitance between the electrodes 110-1, 110-2 due to the deflection of the membrane 140 via the integrated circuit 120, the pressure P is calculated by the integrated circuit 120.

Also the structure of the pressure device 300 allows to use a MEMS structure 130 (MEMS wafer) which does not need to be contacted from the integrated circuit die 360.

The complete device illustrated in FIG. 3 may be packaged in a package providing a mold opening to let the pressure P reach the membrane 140. Additionally, further supporting glass wafers may be used to provide stress decoupling.

A variation of the pressure sensor 300 is illustrated in FIG. 4. FIG. 4 illustrates a pressure sensor 400 which is similar to the pressure sensor 300. However, the pressure sensor 400 is implemented as die level package with ball bonds or solder balls 490 contacting the front side of the integrated circuit die 360 instead of bond wires. In order to protect the circuits on the chip surface, i.e. to protect the integrated circuit 120, an additional polyimide layer (not illustrated) may be provided.

Compared to pressure sensor 300, pressure sensor 400 may additionally comprise two metal layers 480 and 485. Metal layer 480 is formed on the membrane 130 in order to improve the conductivity of the membrane 130. Hence, the coupling of the membrane 130 to the alternating electric field of the electrodes 110-1, 110-2 may be improved. The second metal layer 485 is formed on contact surface of the MEMS structure 140 for contacting the integrated circuit die 360 in order to support the bonding of the MEMS structure 130 to the integrated circuit die 360. However, it is to be noted that the pressure sensor 400 may also be formed without the additional metal layers 480 and 485 or with only one of these metal layers.

In order to avoid through silicon vias, which are a non-standard process step, the integrated circuit die may also be attached to an intermediate wafer (e.g. made of silicon or glass) which does not contain any electronic components. Such pressure sensors are described in the following with respect to FIGS. 5 and 6.

Figure 5:
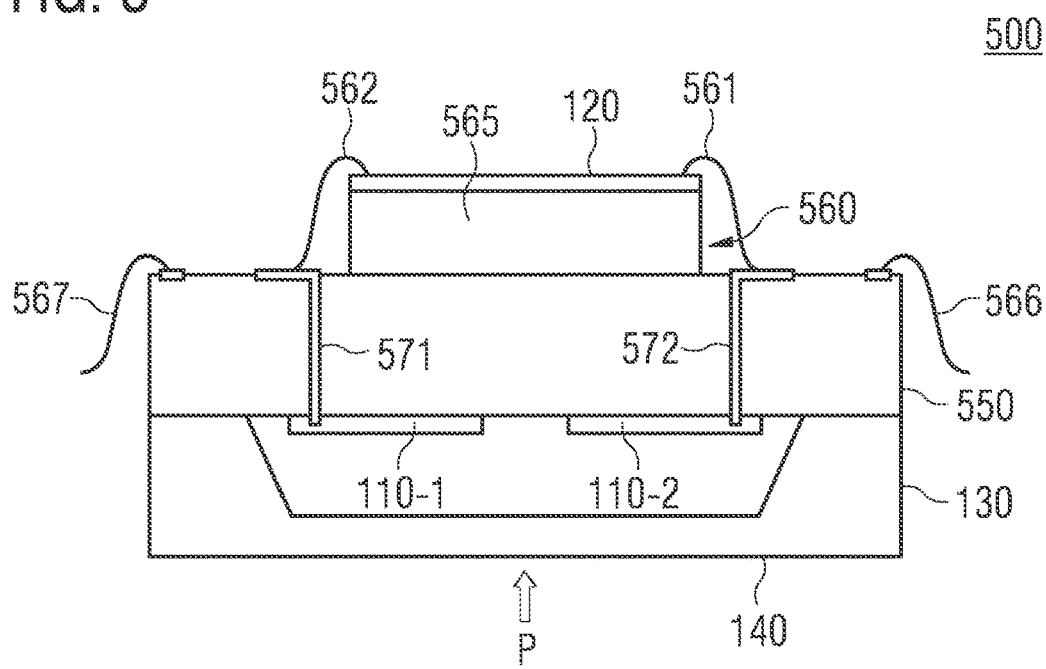
FIG. 5 illustrates a pressure sensor according to one or more embodiments.

FIG. 5 illustrates a pressure sensor 500. The pressure sensor 500 comprises a MEMS structure 130 comprising a conductive or dielectric membrane 140. The MEMS structure 130 is attached (e.g. bonded) to a first surface of a carrier substrate 550 (e.g. made of glass, ceramic or silicon). The MEMS structure 130 consists of nothing else but structured silicon and includes membrane 140. A cavity (e.g. evacuated or hermetically sealed) is formed between the membrane 140 and the carrier substrate 550. Further, the membrane 140 is exposed to a pressure P.

An integrated circuit die 260 is attached to an opposite second surface of the carrier substrate 550. The integrated circuit die 560 comprises an integrated circuit 120, which is arranged on top of a semiconductor substrate 565 of integrated circuit die 560. The integrated circuit 120 is contacted from the outside by bond wires 566 and 567.

Two electrodes 110-1, 110-2 are arranged on the first surface of the carrier substrate 550, i.e. on the same surface side of the carrier substrate 550. The two electrodes 110-1, 110-2 generate an alternating electric field.

The integrated circuit 120 is coupled to the two electrodes 110-1, 110-2 by vias 571, 572 penetrating the carrier substrate 550, and wire bonds 561, 562 for coupling the integrated circuit 120 with the vias 571, 572.

Similar to other embodiments, the membrane 140 moves relative to the two electrodes 110-1, 110-2 depending on the pressure P. The alternating electric field of the two electrodes 110-1, 110-2 is influenced by the deflectable membrane 140 such that the capacitance between the electrodes 110-1, 110-2 is changed. Based on the change of capacitance, the integrated circuit 120 calculates the pressure P.

Figure 6:
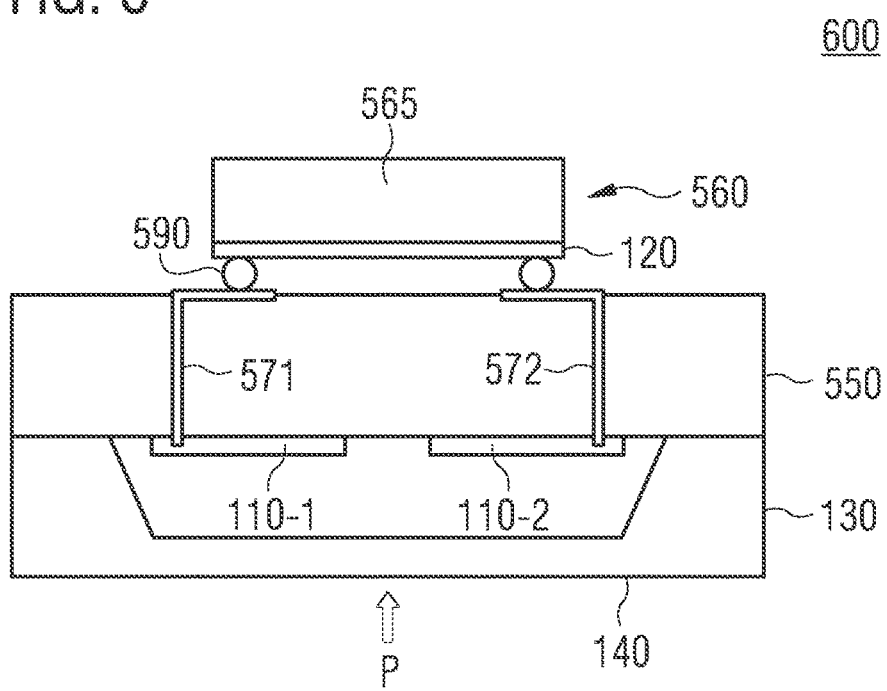
FIG. 6 illustrates a pressure sensor according to one or more embodiments.

In FIG. 6, an alternative coupling of the integrated circuit 120 to the electrodes 110-1, 110-2 is illustrated. The pressure sensor 600 illustrated in FIG. 6 is similar to pressure sensor 500, however, the wire bonds 561, 562 for coupling the integrated circuit 120 with the vias 571, 572 are replaced by ball bonds or solder balls 590 for contacting the front side of the integrated circuit die 360 (i.e. the integrated circuit 120) to the vias 571, 572.

Figure 7:
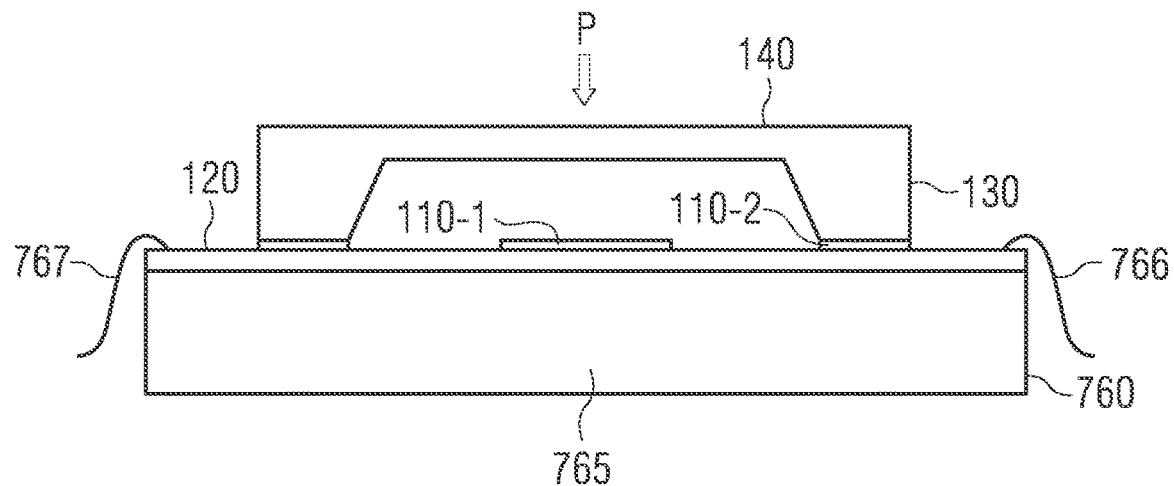
FIG. 7 illustrates a pressure sensor according to one or more embodiments.

An implementation in which the MEMS structure is coupled to the front side of the integrated circuit die is illustrated in FIG. 7. The pressure sensor 700 illustrated in FIG. 7 comprises a MEMS structure 130 comprising a conductive or dielectric membrane 140. An integrated circuit die 760 comprises an integrated circuit 120, which is arranged on top of a semiconductor substrate 765 of integrated circuit die 760.

The MEMS structure 130 is attached to a front side surface of integrated circuit die 760 such that a cavity (e.g. evacuated or hermetically sealed) is formed between the membrane 140 and the integrated circuit die 760. Hence, the integrated circuit 120 is arranged between the MEMS structure 120 and the semiconductor substrate 765 of the integrated circuit die 760.

Two electrodes 110-1, 110-2 are arranged on the front side surface of the integrated circuit die 760. The two electrodes 110-1, 110-2 generate an alternating electric field. The electrode 110-2 is implemented as metal layer formed on a contact surface of the MEMS structure 130 for contacting the integrated circuit die 760. The integrated circuit layer 760 may additionally comprise a surface passivation layer (not illustrated) so that the electrodes 110-1, 110-2 are formed on the passivation layer.

The integrated circuit 120 is coupled to the two electrodes 110-1, 110-2, and senses the capacitance between the two electrodes 110-1, 110-2, which is influenced by the deflectable membrane 140. Based on the change of capacitance, the integrated circuit 120 calculates the pressure P.

A lateral extension of the MEMS structure 130 (i.e. an extension parallel to the front side surface of the integrated circuit die 760) may be smaller than a lateral extension of the integrated circuit die 760 as can be seen from FIG. 7.

Figure 8:
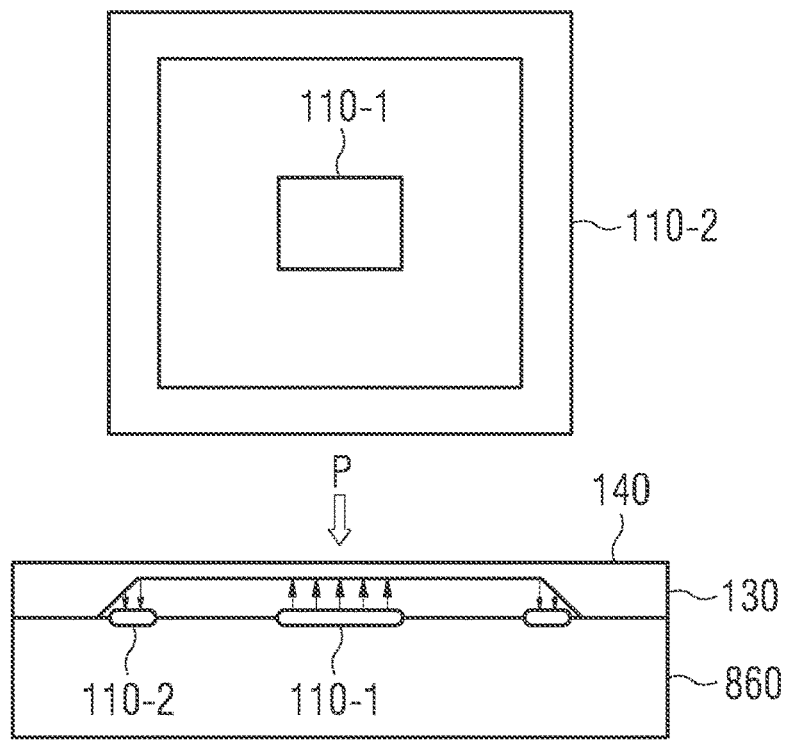
FIG. 8 illustrates a pressure sensor according to one or more embodiments.

Further details of the arrangement of the electrodes with respect to each other are discussed in the following with respect to FIGS. 8 and 9. FIG. 8 illustrates another pressure sensor 800. The pressure sensor 800 illustrated in FIG. 8 comprises a MEMS structure 130 comprising a conductive or dielectric membrane 140. The MEMS structure 130 is attached to an integrated circuit die or carrier substrate 860 (e.g. as in the above examples) such that the at least two electrodes 110-1, 110-2 are separated from the membrane 140 by a (evacuated) cavity. Again, the membrane 140 is configured to move, depending on the pressure P, relative to the two electrodes 110-1, 110-2.

In FIG. 8, the electrodes 110-1, 110-2 are arranged in a manner that the electrical field between each of the electrodes 110-1, 110-2 and the membrane 140 is stronger than the electrical stray field between the electrodes 110-1, 110-2 themselves. In order to achieve this, vertical distances (distance in a direction orthogonal to the main surface of the dies) between the membrane 140 and the two electrodes 110-1, 110-2 are smaller than a distance between the at least two electrodes 110-1, 110-2. In other words, the distance between the electrodes 110-1, 110-2 is larger than the vertical distance between membrane 140 and the electrode surface.

Figure 9:
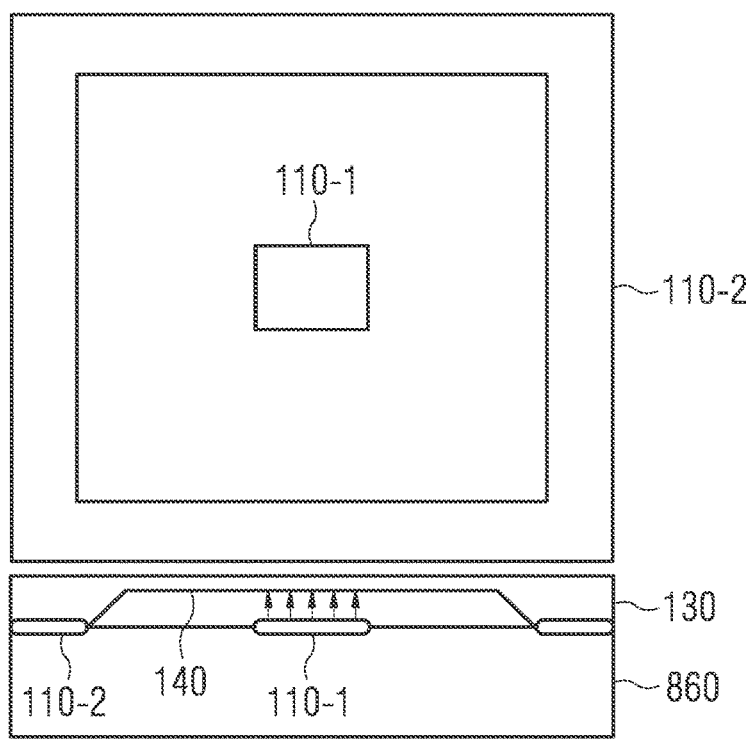
FIG. 9 illustrates a pressure sensor according to one or more embodiments.

In FIG. 9, an alternative implementation in which the MEMS die is galvanically coupled by means of the wafer bond process is illustrated. The pressure sensor 900 illustrated in FIG. 9 is similar to pressure sensor 800. In particular, the vertical distances between the membrane 130 and the two electrodes 110-1, 110-2 are smaller than a distance between the at least two electrodes 110-1, 110-2. However, in the pressure sensor 900, the electrode 110-2 is implemented as metal layer formed on a contact surface of the MEMS structure 130 for contacting the integrated circuit die or carrier substrate 860.

In any of the above exemplary pressure sensors, a MEMS membrane fabricated in a pure MEMS process (a primitive MEMS structure, i.e. a MEMS structure without any electronic devices/electronic components such as metal wires, transistors) may be used to form a capacitive pressure sensor. Accordingly, a low cost pressure sensor may be achieved.

Figure 10:
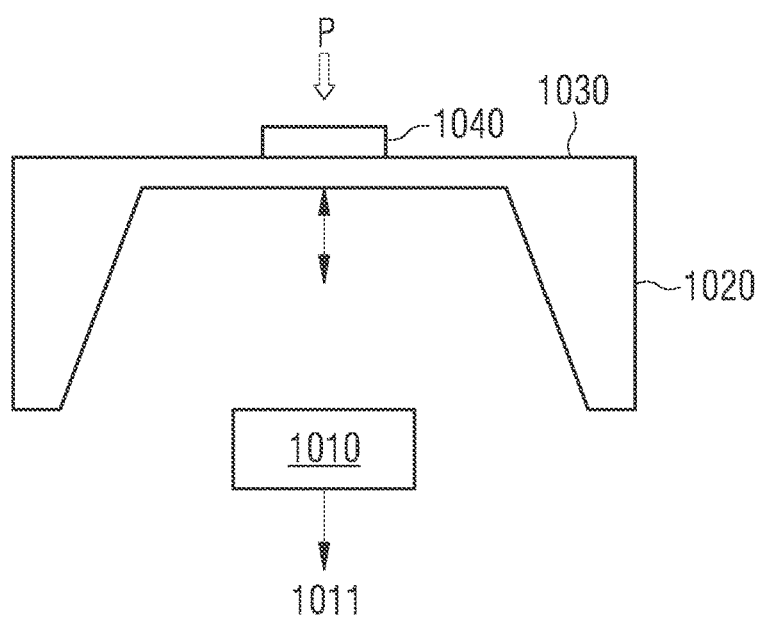
FIG. 10 illustrates a pressure sensor according to one or more embodiments.

FIG. 10 illustrates an alternative pressure sensor 1000, which is based on magnetic field sensing. The pressure sensor 1000 comprises a magnetic sensor element 1010 (Hall sensor, magnetoresistive sensor, etc.) configured to generate a signal 1011 based on a magnetic field sensed by the magnetic sensor element 1010. Further, the pressure sensor 1000 comprises a MEMS structure 1020 comprising a membrane 1030 configured to move, depending on the pressure P, relative to the magnetic sensor element 1010. The pressure sensor 1000 additionally comprises a field influencing element 1040 configured to modify the magnetic field based on a movement of the membrane 1030, wherein the field influencing element 1040 is arranged on the membrane 1030.

Since the membrane 1030 together with the field influencing element 1040 moves relative to the magnetic sensor element 1010 depending on the pressure P, the magnetic field sensed by the magnetic sensor element 1010 varies depending on the pressure P, i.e. the position of the membrane 1030. Due to the detection of the changes of the magnetic field, the pressure sensor 1000 may, hence, allow to measure the pressure P with high resolution. For example, the pressure sensor 1000 may further comprise an integrated circuit (not illustrated) configured to calculate the pressure P based on the signal 1011. Compared to capacitive measurement concepts, parasitic capacities may be minimized or even avoided. Compared to piezoelectric measurement concepts, piezo-resistive stress effects may be avoided. Furthermore, stress-sensitivity may be reduced compared to other sensor concepts, if the pressure sensor 1000 is packaged.

The field influencing element 1040 may be configured to actively generate a magnetic field without requiring an electrical current, or to passively influence (e.g. interact with) a present magnetic field (e.g. earth's magnetic field, or the field of a back-bias magnet).

For example, the field influencing element 1040 may comprise a structure of magnetic material. The magnetic material may be magnetically hard material, magnetically soft material or combination thereof. Alternatively or additionally, the field influencing element 1040 may comprises a conductive structure configured to conduct an electric current (e.g. one or more conductive paths on the membrane 1030).

The magnetic sensor element 1010 may, e.g., comprise a Hall effect region in order to measure changes of the magnetic field by means of the Hall effect. However, the magnetic sensor element 1010 is not limited to measuring changes of the magnetic field via the Hall effect. In general, any kind of the magnetic sensor may be used for measuring changes of the magnetic field.

In some examples, the magnetic sensor element 1010 comprises a Hall effect region of polygonal shape. Further, electrical contacts for providing the signal 1011 from the Hall effect region or for providing electrical supply signals to the Hall effect region are arranged symmetrically along the Hall effect region's periphery. Contacting the Hall effect region in a symmetric manner may allow to minimize the residual offset of the signal 1011. Hence, the accuracy of measuring changes of the magnetic field may be increased.

Moreover, the magnetic sensor element 1010 may be configured to operate the Hall effect region in a spinning scheme. In the spinning scheme, the supply or sense role of the electrical contact regions is changed in multiple clock phases: Each electrical contact region provides (supplies) an electrical signal to the Hall effect region for an integer number n of clock phases and provides (taps) an electrical signal from the Hall effect region for the same number n of clock phases. For example, in a spinning-current scheme with four electrical contact regions, a first and a second one of the four activated electrical contact regions supply a current signal to the Hall effect region in a first clock phase, whereas a third and a fourth one of the four electrical contact regions tap the electrical signal (i.e. a voltage signal) from the Hall effect region. In a second clock phase, the third and fourth one of the four electrical contact regions supply the current signal to the Hall effect region, whereas the first and the second one of the four electrical contact regions tap the electrical signal from the Hall effect region 110. Similarly, in the case of a spinning-voltage scheme, a voltage signal is supplied to the Hall effect region instead of a current signal, and a current signal is tapped from the Hall effect region instead of a voltage signal. The residual offset of the signal 1011 may, hence, be further reduced.

In some example, the pressure sensor 1000 additionally comprises a permanent magnetic element (not illustrated). The permanent magnetic element and the field influencing element 1040 are arranged on opposite sides of the magnetic sensor element 1010. That is, the pressure sensor 1000 may additionally comprise a back-bias magnet. The permanent magnetic element generates a constant magnetic field, which is influenced by the field influencing element 1040.

The disturbance of the back-bias magnet's constant magnetic field by the field influencing element 1040 due to the pressure P is detected by the magnetic sensor element 1010, so that signal 1011 is indicative of the pressure P.

Similar to the pressure sensors illustrated in FIGS. 2, 5, and 6, the magnetic sensor element 1010 and the MEMS structure 1020 may be attached to opposite sides of a carrier substrate (not illustrated, e.g. made of glass, ceramic or silicon) such that a (evacuated) cavity is formed between the membrane 1030 and the carrier substrate.

In the following, some exemplary implementations of the above general concept will be described in connection with FIGS. 11 to 13.

Figure 11:
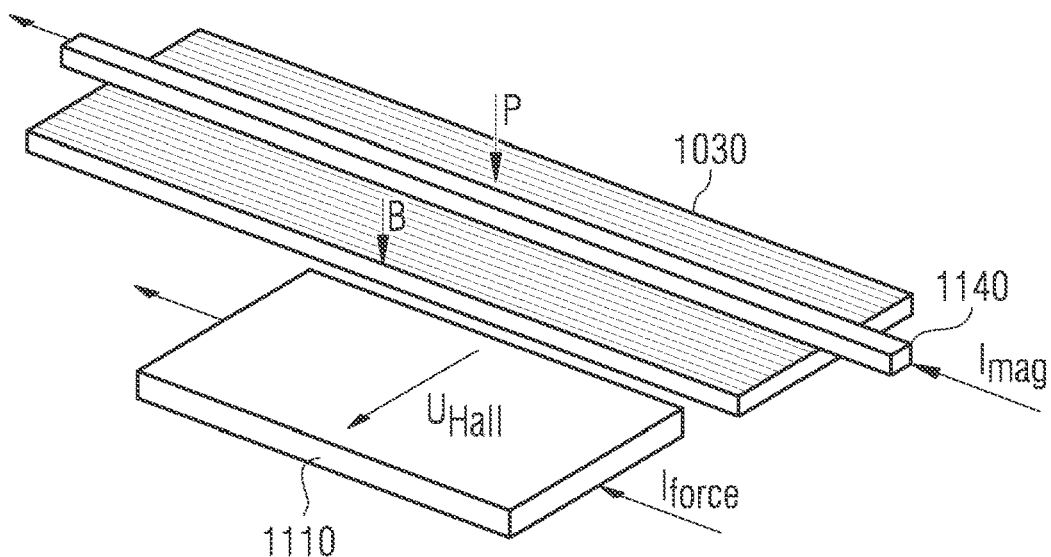
FIG. 11 illustrates a pressure sensor according to one or more embodiments.

FIG. 11 illustrates a pressure sensor 1100 comprising a membrane 1030, which is part of a MEMS structure (the further elements of the MEMS structure are not illustrated). Further, the pressure sensor 1100 comprises a Hall effect region 1110 which serves as magnetic sensor element. The membrane 1030 moves, depending on the pressure P it is exposed to, relative to the Hall effect region 1110. A conductive path 1140 is formed on the membrane 1030 which serves as field influencing element. The conductive path 1140 conducts a current $I_{mag}$, so that according to Ampere's law a magnetic field B is generated which is proportional to the current $I_{mag}$. The generated magnetic field B and the earth's magnetic field superimpose.

A current $I_{force}$ is applied to the Hall effect region 1110, so that the Hall effect region 1110 generates a voltage signal $$U_{Hall} \propto I_{force} \cdot B_{abs} \qquad (1),$$

with $B_{abs}$ denoting the superposition of the generated magnetic field B and the earth's magnetic field.

Since the membrane 1030 is exposed to the pressure P, the position of the membrane 1030 and, hence, the conductive path 1140 relative to the Hall effect region 1110 changes in dependency on the pressure P. Accordingly, also the strength of the generated magnetic field B in the vicinity of the Hall effect region 1110 changes in dependency on the pressure P. That is, $B_{abs}$ in expression (1) varies depending on the pressure P. Accordingly, the voltage signal $U_{Hall}$ is proportional to the deflection of membrane 1030, i.e. the pressure P. Accordingly, an integrated circuit (not illustrated) of the pressure sensor 1100 may calculate the pressure P based on the voltage signal $U_{Hall}$.

As indicated above in connection with FIG. 10, the Hall effect region 1110 may be of polygonal shape, and may be operated in a spinning scheme. Further, the pressure sensor 1100 may comprise a permanent magnetic element (back-bias magnet) generating a constant magnetic field that is influenced by the magnetic field B of the conductive path 1140

Figure 12:
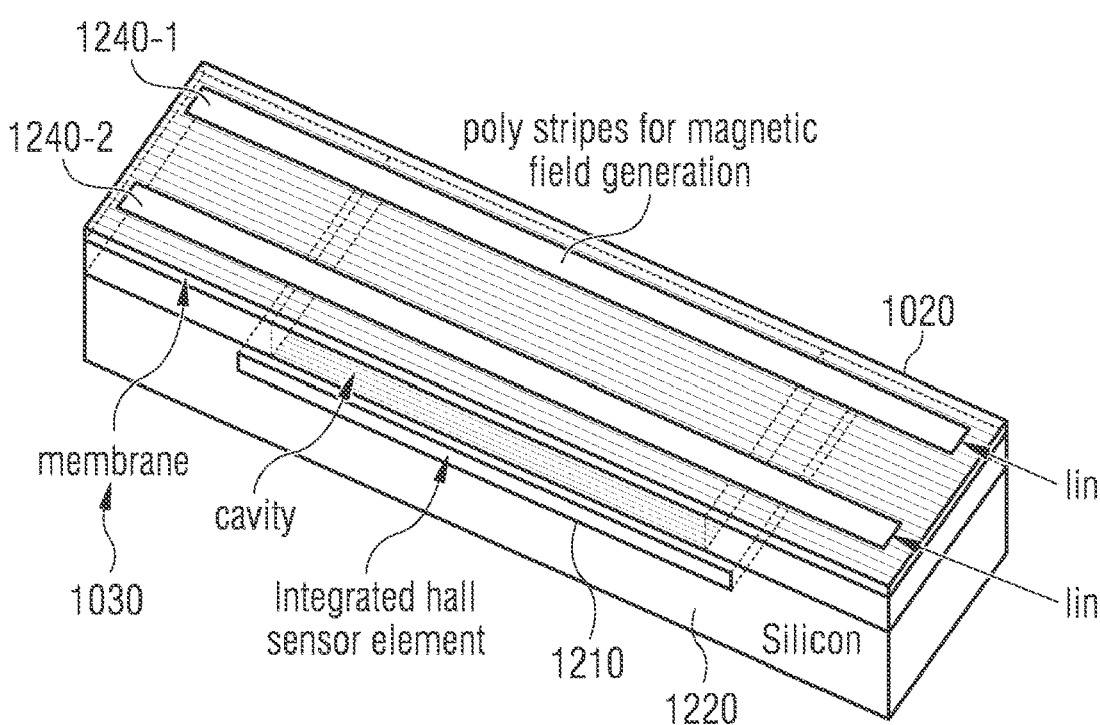
FIG. 12 illustrates a pressure sensor according to one or more embodiments.

A more detailed implementation of a pressure sensor 1200 is illustrated in FIG. 12. The pressure sensor 1200 comprises MEMS structure 1020 comprising a membrane 1030. The MEMS structure 1020 is attached to a sensor element die 1220, which comprises a Hall effect region 1210 serving as magnetic sensor element. For example, the sensor element die 1220 may be based on silicon. A (evacuated) cavity is formed between the membrane 1030 and the sensor element die 1220.

Like for pressure sensor 1100 illustrated in FIG. 11, the membrane 1030 moves, depending on the pressure P it is exposed to, relative to the Hall effect region 1210. In contrast to pressure sensor 1100, the pressure sensor 1200 comprises two parallel conductive paths 1240-1, 1240-2 each conducting a current $I_{in}$. As indicated in FIG. 12, the conductive paths 1240-1, 1240-2 may conduct the current $I_{in}$ a parallel manner (i.e. in a same direction). Alternatively, the conductive paths 1240-1, 1240-2 may conduct the current $I_{in}$ in an anti-parallel manner (i.e. in opposite directions). It is to be noted that not only two but any number of conductive paths for conducting a current may be used.

The conductive paths 1240-1, 1240-2 each conducting the current $I_{in}$ generate a magnetic field. Again, the strength of the generated magnetic field in the vicinity of the Hall effect region 1210 changes in dependency on the pressure P. Accordingly, the voltage signal of the Hall effect region is proportional to the deflection of membrane 1030, i.e. the pressure P.

Also the Hall effect region 1210 may be of polygonal shape, and may be operated in a spinning scheme. Further, the pressure sensor 1200 may comprise a permanent magnetic element (back-bias magnet) generating a constant magnetic field that is influenced by the magnetic field of the conductive paths 1240-1, 1240-2.

For example, the conductive paths in the pressure sensors 1100 and 1200 may be made of polysilicon. In general, the polystripes generate a magnetic via the current Iin, which is directed towards the Hall plate center (z direction). When the membrane deflects under pressure, the conducting polystripes get closer to the Hall probe so that the magnet field strength increases in the vicinity of the Hall probe. The generated Hall signal is, hence, proportional to the deflection of the membrane and, hence, proportional to the pressure.

Figure 13:
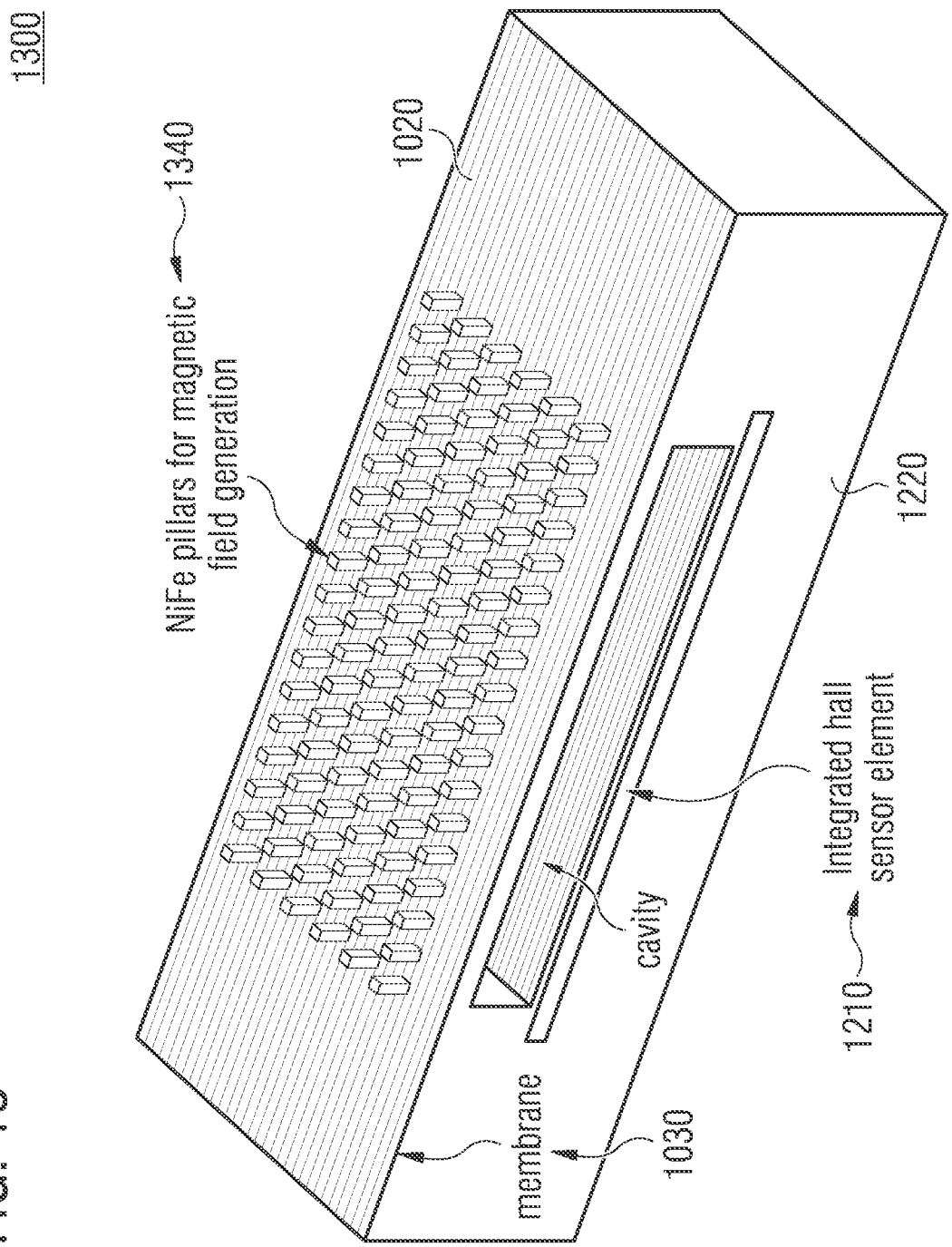
FIG. 13 illustrates a pressure sensor according to one or more embodiments.

An alternative implementation of the field influencing element is illustrated in FIG. 13. FIG. 13 illustrates a pressure sensor 1300 which comprises a structure 1340 of magnetic material instead of the conductive paths.

The structure 1340 of magnetic material comprises a plurality of pillars made of magnetic material. The average extension of a pillar along a first direction is at least 5, 10, 15, 20, 25, 50 or 100 times than greater than its average extension along a second direction and third direction, wherein the first direction, the second direction and the third direction are perpendicular to each other. In other words, a diameter of the pillar is (much) smaller than its height.

The pillars may be made of a magnetically hard material, magnetically soft material or combination thereof. For example, the pillars may be made of NiFe or FeCo. In the example of FIG. 13, NiFe pillars are illustrated. The NiFe pillars may, e.g., be magnetized by means of a FUTEK process (i.e. using an oven comprising a magnetic field coil).

The NiFe pillars generate a magnetic field which is directed towards the Hall plate center (z direction). When the membrane deflects under pressure, the NiFe pillars get closer to the Hall probe so that the magnet field strength increases in the vicinity of the Hall probe. The generated Hall signal is, hence, proportional to the deflection of the membrane and, hence, proportional to the pressure.

The pressure sensor 1300 may additionally comprise a permanent magnetic element (back-bias magnet) generating a constant magnetic field that is influenced by the magnetic field of the structure 1340 of magnetic material.

Although, the exemplary pressure sensors illustrated in FIGS. 11 to 13 comprise either conducting paths or a structure of magnetic material, a pressure sensor according to the proposed concept may comprise both. For example, one or conducting paths and a structure of magnetic material may be arranged on opposite sides of the membrane. For example, the pressure sensors 1100 and 1200 illustrated in FIGS. 11 and 12 may additionally comprise a structure of magnetic material on the lower side of membrane 1030. Also the pressure sensor 1300 illustrated in FIG. 13 may additionally comprise one or more conductive paths for conducting a current on the lower side of membrane 1030.

As can be seen from pressure sensors 1000 to 1300, the pressure may be measured via the change of a magnetic field in the vicinity of a Hall probe, which is arranged underneath the cavity of the membrane for detecting the magnetic signal. The pressure membrane may comprise conducting polystripes and/or magnetic elements (e.g. NiFe, Fe-Co . . . ). When the pressure changes, the distance of the membrane and, hence, the conducting polystripes and/or the magnetic elements to the underneath Hall probe changes. Accordingly, the strength of the magnetic field changes. The generated Hall signal is, hence, proportional to the deflection of the membrane and, hence, proportional to the pressure.

Two or more of the above pressure sensors may be combined to form an array of pressure sensors. A sensor device may comprise the array of pressure sensors.

An example of a method 1400 for forming a MEMS pressure sensor is illustrated by means of a flowchart in FIG. 14. The method 1400 comprises providing 1402 a first (MEMS) substrate comprising in a recessed portion a recess and a membrane shaped by the recess. The membrane comprises at least one field influencing element. Further, the method 1400 comprises providing 1404 a second substrate comprising a read-out element and a read-out circuit coupled to the read-out element. The method 1400 additionally comprises bonding 1406 the first substrate to the second substrate such that the recess is hermetically sealed, thereby forming a sealed cavity.

With the method 1400 pressure sensors as described above may be manufactured in a cost-effective manner. In particular, the method 1400 may allow to manufacture pressure sensors based on MEMS substrates (used as first substrates) without any electronics, i.e. MEMS substrates not holding any electronic components.

In some examples, the first substrate may have no electrical connection to the second substrate after the bonding. In other words, the first substrate may be galvanically isolated from the second substrate.

Bonding 1406 the first substrate to the second substrate may comprise directly bonding the first substrate to the second substrate (e.g. directly bonding a MEMS structure to an integrated circuit die) such that the second substrate hermetically seals the recess in order to form the sealed cavity. Alternatively, bonding 1406 the first substrate to the second substrate may comprise bonding the first substrate and the second substrate to opposite sides of an intermediate substrate (e.g. bonding a MEMS structure and an integrated circuit die to opposite sides of a carrier substrate) such that the intermediate substrate hermetically seals the recess in order to form the sealed cavity.

As described above in connection with the proposed pressure sensors, the field influencing element may be an electric field influencing element (e.g. conductive or dielectric membrane, metallization on membrane) or a magnetic field influencing element (e.g. a magnetic material or a conductive structure conducting an electric current).

The read-out circuit may be an integrated circuit coupled to the read-out element.

More details and aspects of the method are mentioned in connection with the proposed concept or one or more examples described above (e.g., FIGS. 1-13). The method may comprise one or more additional optional features corresponding to one or more aspects of the proposed concept or one or more examples described above.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A pressure sensor, comprising:
   at least two electrodes laterally arranged with respect to each other in a first direction;
   an integrated circuit configured to sense a capacitance between the at least two electrodes; and
   a microelectromechanical system (MEMS) structure comprising a membrane configured to move, depending on a pressure applied thereto, in a second direction orthogonal to the first direction and relative to the at least two electrodes, wherein the membrane is a conductive membrane or a dielectric membrane,
   wherein the at least two electrodes are separated in the second direction from the membrane by an evacuated cavity such that the evacuated cavity is arranged between a plane in which the at least two electrodes are arranged and the membrane, and
   wherein the MEMS structure is free from electronic components and has no electrical connection to the integrated circuit.

2. The pressure sensor of claim 1, wherein the at least two electrodes are arranged on a rigid region of the pressure sensor, wherein the at least two electrodes are immovably fixed within the pressure sensor.

3. The pressure sensor of claim 1, further comprising:
   an integrated circuit die comprising the integrated circuit, wherein the integrated circuit is configured to calculate the pressure based on the sensed capacitance between the at least two electrodes.

4. The pressure sensor of claim 1, wherein vertical distances between the membrane and the at least two electrodes are smaller than a distance between the at least two electrodes.

5. The pressure sensor of claim 1, wherein the MEMS structure is free from electronic components has no electrical connection to the integrated circuit.

6. A pressure sensor, comprising:
   at least two electrodes laterally arranged with respect to each other in a first direction;
   an integrated circuit configured to sense a capacitance between the at least two electrodes;
   a microelectromechanical system (MEMS) structure comprising a membrane configured to move, depending on a pressure applied thereto, in a second direction orthogonal to the first direction and relative to the at least two electrodes, wherein the membrane is a conductive membrane or a dielectric membrane;
   an integrated circuit die comprising the integrated circuit, wherein the integrated circuit is configured to calculate the pressure based on the sensed capacitance between the at least two electrodes; and
   a carrier substrate to which the integrated circuit die and the MEMS structure are coupled, wherein the at least two electrodes are separated in the second direction from the membrane by an evacuated cavity such that the evacuated cavity is arranged between a plane in which the at least two electrodes are arranged and the membrane, wherein the integrated circuit die and the MEMS structure are attached to opposite sides of the carrier substrate such that the integrated circuit die is attached to a first side of the carrier substrate and the MEMS structure is coupled to a second side of the carrier substrate opposite to the first side, and wherein an evacuated cavity is formed between the membrane and the second side of the carrier substrate.

7. The pressure sensor of claim 6, wherein the at least two electrodes are arranged on a same surface side of the carrier substrate, wherein the same surface side is the second side of the carrier substrate.

8. The pressure sensor of claim 7, wherein the integrated circuit is electrically coupled to the at least two electrodes by vias penetrating through the carrier substrate.

9. A pressure sensor, comprising:
at least two electrodes laterally arranged with respect to each other in a first direction;
an integrated circuit configured to sense a capacitance between the at least two electrodes;
a microelectromechanical system (MEMS) structure comprising a membrane configured to move, depending on a pressure applied thereto, in a second direction orthogonal to the first direction and relative to the at least two electrodes, wherein the membrane is a conductive membrane or a dielectric membrane;
an integrated circuit die comprising the integrated circuit, wherein the integrated circuit is configured to calculate the pressure based on the sensed capacitance between the at least two electrodes; and
a carrier substrate to which the integrated circuit die and the MEMS structure are coupled,
wherein the at least two electrodes are separated in the second direction from the membrane by an evacuated cavity such that the evacuated cavity is arranged between a plane in which the at least two electrodes are arranged and the membrane,
wherein the carrier substrate is made of dielectric material, and
wherein the at least two electrodes are arranged within the integrated circuit die and are arranged between semiconductor layers of the integrated circuit and the MEMS structure.

10. The pressure sensor of claim 9, wherein a first side of the integrated circuit die is coupled to a surface of the carrier substrate and a second side of the integrated circuit die, arranged opposite to the first side, is coupled to the MEMS structure such that the carrier substrate is interposed between the integrated circuit die and the MEMS structure.

11. The pressure sensor of claim 9, wherein the integrated circuit die is bonded to the carrier substrate, wherein a first electrode is arranged in a first region below a center region of the membrane, a second electrode is arranged in a second region below the center region of the membrane, a third electrode and a fourth electrode are laterally arranged on opposite sides of the center region in the first direction, wherein the third electrode is arranged in a third region below a first peripheral rim portion of the MEMS structure carrying the membrane and the fourth electrode is arranged in a fourth region below a second peripheral rim portion of the MEMS structure carrying the membrane.

12. The pressure sensor of claim 11, wherein the first region, the second region, the third region, and the fourth region are laterally separated from each other in the first direction.

13. The pressure sensor of claim 9, wherein the integrated circuit die is bonded to the carrier substrate, wherein a first electrode is arranged in a first region below a center of the membrane, and wherein a second electrode and a third electrode are laterally arranged on opposite sides of the first electrode in the first direction, wherein the second electrode is arranged in a second region below a first peripheral rim portion of the MEMS structure carrying the membrane and the third electrode is arranged in a third region below a second peripheral rim portion of the MEMS structure carrying the membrane.

14. The pressure sensor of claim 13, wherein the first region, the second region, and the third region are laterally separated from each other in the first direction.

15. The pressure sensor of claim 13, wherein the integrated circuit is configured to calculate the pressure based on a first capacitance sensed between the second electrode and the third electrode, a second capacitance sensed between the first electrode and the second electrode, and a third capacitance sensed between the first electrode and the third electrode.

16. The pressure sensor of claim 15, wherein at least one fourth electrode is arranged between the first electrode and the second electrode or the third electrode, wherein minimum distances of the at least one fourth electrode to the second electrode or to the third electrode are smaller than a minimum distance of the at least one fourth electrode to the first electrode.

17. The pressure sensor of claim 16, wherein the integrated circuit is further configured to calculate the pressure based on fourth capacitances sensed between the at least one fourth electrode and one of the second electrode and the third electrode.

18. The pressure sensor of claim 17, wherein a sum of the fourth capacitances are at least three times higher than a sum of the second capacitance and the third capacitance when the membrane is in a rest position.

19. A pressure sensor, comprising:
at least two electrodes laterally arranged with respect to each other in a first direction;
an integrated circuit configured to sense a capacitance between the at least two electrodes;
a microelectromechanical system (MEMS) structure comprising a membrane configured to move, depending on a pressure applied thereto, in a second direction orthogonal to the first direction and relative to the at least two electrodes, wherein the membrane is a conductive membrane or a dielectric membrane; and
an integrated circuit die comprising the integrated circuit, wherein the integrated circuit is configured to calculate the pressure based on the sensed capacitance between the at least two electrodes,
wherein the at least two electrodes are separated in the second direction from the membrane by an evacuated cavity such that the evacuated cavity is arranged between a plane in which the at least two electrodes are arranged and the membrane,
wherein the MEMS structure is attached to a surface of the integrated circuit die such that an evacuated cavity is formed between the membrane and the integrated circuit die.

20. The pressure sensor of claim 19, wherein the integrated circuit is arranged between the MEMS structure and a semiconductor substrate of the integrated circuit die.

21. The pressure sensor of claim 19, wherein a metal layer is formed on at least one of the membrane and a contact surface of the MEMS structure for contacting the integrated circuit die.

22. The pressure sensor of claim 21, wherein the metal layer formed on the contact surface of the MEMS structure is one of the at least two electrodes.

23. The pressure sensor of claim 19, wherein the integrated circuit and the MEMS structure are arranged on opposite sides of a semiconductor substrate of the integrated circuit die.

24. The pressure sensor of claim 23, wherein the integrated circuit and the at least two electrodes are arranged on opposite sides of the semiconductor substrate, and wherein the integrated circuit is coupled to the at least two electrodes by vias penetrating the integrated circuit die.

25. A pressure sensor comprising:
at least two electrodes comprising a first electrode, a second electrode, and a third electrode;
an integrated circuit die comprising an integrated circuit configured to sense a capacitance between the at least two electrodes, wherein the integrated circuit is configured to calculate the pressure based on the sensed capacitance between the at least two electrodes; and
a microelectromechanical system (MEMS) structure comprising a membrane configured to move in a deflection direction, depending on a pressure applied thereto, relative to the at least two electrodes, wherein the membrane is a conductive membrane or a dielectric membrane,
wherein the a first electrode is arranged in a first region overlapping with a center region of the membrane, and wherein the second electrode and the third electrode are laterally arranged on opposite sides of the first electrode in a lateral direction that is orthogonal to the deflection direction, wherein the second electrode is arranged in a second region overlapping with a first peripheral rim portion of the MEMS structure carrying the membrane and the third electrode is arranged in a third region overlapping with a second peripheral rim portion of the MEMS structure carrying the membrane.

26. The pressure sensor of claim 25, wherein the first region, the second region, and the third region are laterally separated from each other in the lateral direction.

27. The pressure sensor of claim 25, wherein the at least two electrodes further comprises at least one fourth electrode laterally arranged between the first electrode and the second electrode or laterally arranged between the first electrode and the third electrode.

28. The pressure sensor of claim 27, wherein minimum distances of the at least one fourth electrode to the second electrode or to the third electrode are smaller than a minimum distance of the at least one fourth electrode to the first electrode.

29. The pressure sensor of claim 25, wherein:
the first peripheral rim portion and the second peripheral rim portion are coupled to the integrated circuit die, and
an evacuated cavity is formed between a plane in which the at least two electrodes are arranged and the membrane, the evacuated cavity being delimited by the first peripheral rim portion, the second peripheral rim portion, and the membrane.

30. The pressure sensor of claim 29, wherein the first peripheral rim portion, the second peripheral rim portion, and the membrane, together, form a concave shape or U-shape defining the evacuated cavity.

31. The pressure sensor of claim 29, wherein the first peripheral rim portion and the second peripheral rim portion are coupled to a peripheral region of the membrane, the peripheral region being peripheral to the center region of the membrane.

32. The pressure sensor of claim 29, further comprising:
a carrier substrate coupled to the integrated circuit die and to the MEMS structure and interposed therebetween,
wherein the at least two electrodes are arranged within the integrated circuit die.

33. A pressure sensor comprising:
at least two electrodes comprising a first electrode, a second electrode, and a third electrode;
an integrated circuit die comprising an integrated circuit configured to sense a capacitance between the at least two electrodes, wherein the integrated circuit is configured to calculate the pressure based on the sensed capacitance between the at least two electrodes; and
a microelectromechanical system (MEMS) structure comprising a membrane configured to move in a deflection direction, depending on a pressure applied thereto, relative to the at least two electrodes, wherein the membrane is a conductive membrane or a dielectric membrane,
wherein the a first electrode is arranged in a first region overlapping with a center region of the membrane, and wherein the second electrode and the third electrode are laterally arranged on opposite sides of the first electrode in a lateral direction that is orthogonal to the deflection direction, wherein the second electrode is arranged in a second region overlapping with a first peripheral region of the membrane and the third electrode is arranged in a third region overlapping with a second peripheral region of the membrane,
wherein the first region, the second region, and the third region are laterally separated from each other in the lateral direction.

* * * * *